US011211905B2

United States Patent
Yasuda et al.

(10) Patent No.: US 11,211,905 B2
(45) Date of Patent: Dec. 28, 2021

(54) SEMICONDUCTOR DEVICE AND MEMORY SYSTEM

(71) Applicant: TOSHIBA MEMORY CORPORATION, Tokyo (JP)

(72) Inventors: Yohei Yasuda, Yokohama Kanagawa (JP); Hidefumi Kushibe, Kamakura Kanagawa (JP); Toshihiro Yagi, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 76 days.

(21) Appl. No.: 16/553,717

(22) Filed: Aug. 28, 2019

(65) Prior Publication Data

US 2020/0266774 A1 Aug. 20, 2020

(30) Foreign Application Priority Data

Feb. 19, 2019 (JP) .............................. JP2019-027849

(51) Int. Cl.
*H03F 3/16* (2006.01)
*H03F 3/45* (2006.01)
(52) U.S. Cl.
CPC ........... *H03F 3/16* (2013.01); *H03F 3/45376* (2013.01); *H03F 3/45632* (2013.01)
(58) Field of Classification Search
CPC .... H03F 3/16; H03F 3/45632; H03F 3/45376; H03F 1/0205; H03F 2203/45644; H03F 3/45237; H03F 3/45179; H03F 1/301; G11C 7/1084; G11C 7/1057; G11C 7/1069; G11C 11/40; G11C 11/36; G11C 5/147

USPC .......................................... 330/252–261, 277
See application file for complete search history.

(56) References Cited

U.S. PATENT DOCUMENTS

| 7,639,043 | B2 * | 12/2009 | Koike ................. H03F 3/45237 |
| | | | 326/82 |
| 9,083,295 | B2 | 7/2015 | Yamauchi |
| 9,571,101 | B2 | 2/2017 | Watanabe |
| 9,634,629 | B2 | 4/2017 | Watanabe |
| 2017/0084313 | A1 | 3/2017 | Yasuda et al. |

FOREIGN PATENT DOCUMENTS

| JP | H07-113826 A | 5/1995 |
| JP | H08-186452 A | 7/1996 |

* cited by examiner

*Primary Examiner* — Hieu P Nguyen
(74) *Attorney, Agent, or Firm* — Foley & Lardner LLP

(57) ABSTRACT

According to one embodiment, in a first differential amplifier circuit of a semiconductor device, a first transistor receives an input signal at the gate. A second transistor forms a differential pair with the first transistor. The second transistor receives a reference signal at the gate. A third transistor is connected in series with the first transistor. A fourth transistor is connected in series with the second transistor. A fifth transistor is disposed on the output side. The fifth transistor forms a first current mirror circuit with the fourth transistor. A sixth transistor is connected to the drain of the second transistor in parallel with the fourth transistor. The sixth transistor forms a second current mirror circuit with the fifth transistor. A first discharge circuit is connected to the source of the sixth transistor.

17 Claims, 9 Drawing Sheets

SEMICONDUCTOR DEVICE AND MEMORY SYSTEM

CROSS-REFERENCE TO RELATED APPLICATION(S)

This application is based upon and claims the benefit of priority from Japanese Patent Application No. 2019-027849, filed Feb. 19, 2019, the entire contents of which are incorporated herein by reference.

FIELD

Embodiments described herein relate generally to semiconductor devices and memory systems.

BACKGROUND

A semiconductor device including a differential amplifier circuit, which receives an input signal and a reference signal by a pair of transistors that form a differential pair, generates a differential signal by amplifying a difference between the input signal and the reference signal by using a power supply voltage. In this case, extending the operating voltage range of the differential amplifier circuit is desirable. Examples of related art include U.S. Pat. Nos. 9,634,629 and 9,571,101.

DETAILED DESCRIPTION

Figure 1:
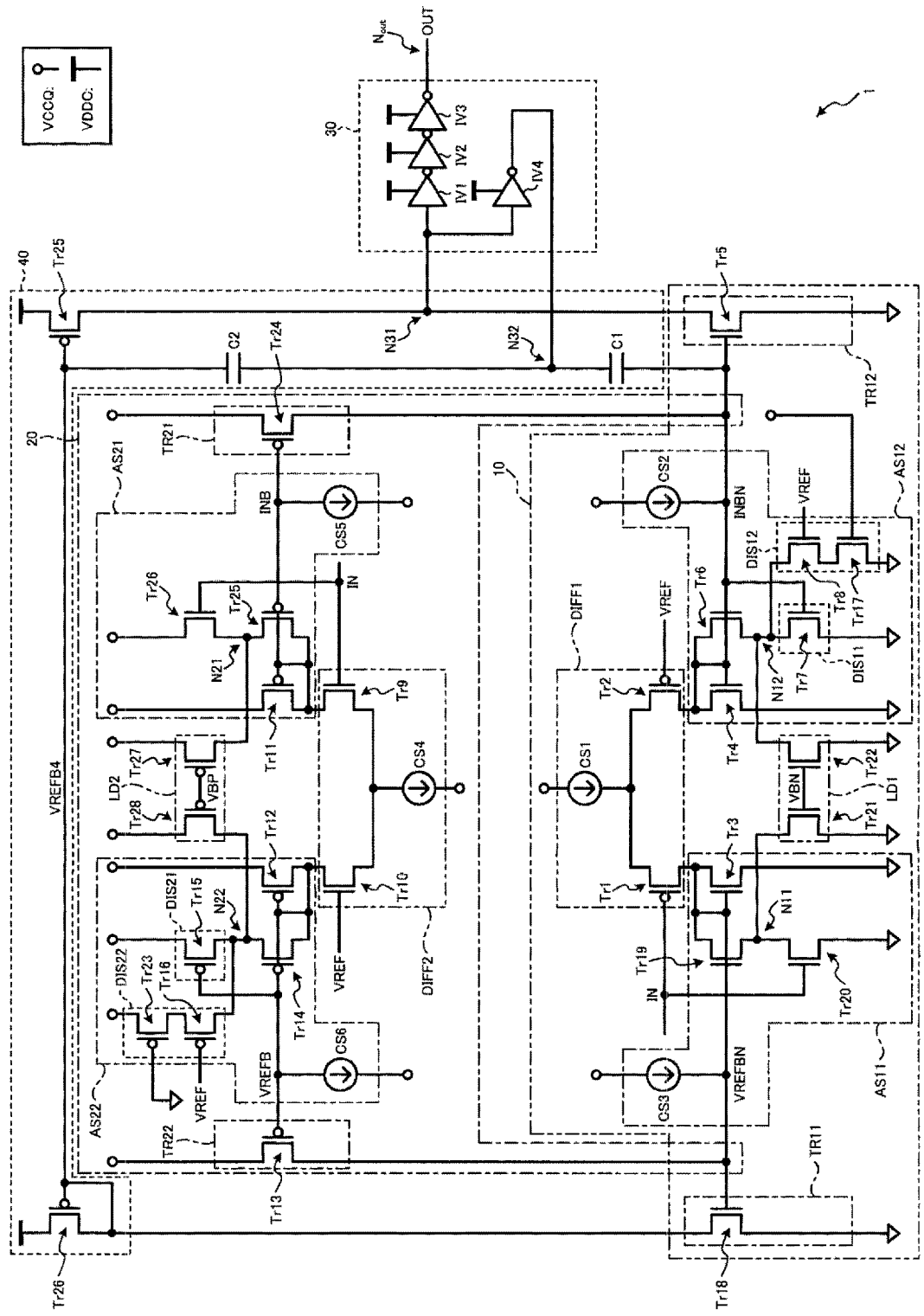
FIG. 1 is a circuit diagram depicting the configuration of a semiconductor device according to a first embodiment.

Embodiments provide a semiconductor device, which can extend the operating voltage range of a differential amplifier circuit, and a memory system.

In general, according to one embodiment, a semiconductor device including a first differential amplifier circuit is provided. The first differential amplifier circuit includes a first transistor, a second transistor, a third transistor, a fourth transistor, a fifth transistor, a sixth transistor, and a first discharge circuit. The first transistor receives an input signal at the gate. The second transistor forms a differential pair with the first transistor. The second transistor receives a reference signal at the gate. The third transistor is connected in series with the first transistor. The fourth transistor is connected in series with the second transistor. The fifth transistor is disposed on the output side. The fifth transistor forms a first current mirror circuit with the fourth transistor. The sixth transistor is connected to the drain of the second transistor in parallel with the fourth transistor. The sixth transistor forms a second current mirror circuit with the fifth transistor. The first discharge circuit is connected to the source of the sixth transistor.

Hereinafter, a semiconductor device according to an embodiment will be described in detail with reference to the accompanying drawings. This embodiment is not intended for limitation.

First Embodiment

A semiconductor device according to a first embodiment includes a differential amplifier circuit. The differential amplifier circuit receives an input signal and a reference signal by a pair of transistors which form a differential pair. The differential amplifier circuit generates a differential signal by amplifying a difference between the input signal and the reference signal by using a power supply voltage. The semiconductor device including the differential amplifier circuit is sometimes used as a receiver of a high-speed interface of semiconductor memory. In this case, enhancing the speed of an operation of the differential amplifier circuit is desirable.

For example, in the differential amplifier circuit, an assist circuit, in which a diode-connected transistor forming a current mirror with an output-side transistor and a transistor receiving a signal at the gate are vertically stacked, is sometimes provided on the input signal side and the reference signal side. With these assist circuits, the mirror ratio of the current mirror can be changed in accordance with the input signal and consequently the differential amplifier circuit can be operated at high speed. That is, the assist circuits can cause an increase in the overall gain of the differential amplifier circuit, which results in the enhancement of the speed of the differential amplifier circuit.

In this differential amplifier circuit, sometimes a charge remains at an intermediate node in the assist circuit on the reference signal side when the power supply voltage is low, which makes the transistors enter a high resistance state. This can cause a loss of balance between the assist circuit on the reference signal side and the assist circuit on the input signal side and deterioration of the duty ratio (that is, a deviation of the duty ratio from a proper range) of an output signal. As a result, for instance, duty cycle distortion (DCD) is increased and any one of the setup time and the hold time or both of a signal do not satisfy required specifications. Consequently, there is a possibility that the signal cannot be properly used in an internal circuit to which the signal is output. That is, by making improvements so that the differential amplifier circuit can operate even at a low power supply voltage while maintaining the effect of the enhanced speed achieved by the assist circuits, extending the range of the power supply voltage in which the differential amplifier circuit can operate properly is desirable.

Thus, in the first embodiment, in the differential amplifier circuit of the semiconductor device, by providing, in the assist circuit on the reference signal side, a circuit that can form a discharge path from the intermediate node, the range of the power supply voltage in which the differential amplifier circuit can operate properly is extended.

Specifically, a semiconductor device 1 may be configured as depicted in FIG. 1. FIG. 1 is a circuit diagram depicting the configuration of the semiconductor device 1.

The semiconductor device 1 makes a single-input single-output circuit possible by using two differential amplifier circuits, one of which has elements whose polarities are opposite to the polarities of the counterparts of the other. The semiconductor device 1 receives an input signal IN as a single input, converts the input signal IN into a differential signal and performs amplification processing on the differential signal, and generates an output signal OUT from the processed differential signal and outputs the output signal OUT as a single output.

The semiconductor device 1 includes a differential amplifier circuit 10, a differential amplifier circuit 20, a level shifter 40, and an output circuit 30. The differential amplifier circuit 10 and the differential amplifier circuit 20 are disposed in parallel with each other on the input side of the level shifter 40. The level shifter 40 is disposed between the differential amplifier circuits 10 and 20 and the output circuit 30.

The differential amplifier circuit 10 receives the input signal IN and a reference signal VREF by a pair of transistors Tr1 and Tr2, respectively, which form a differential pair, and generates a differential signal VO10 by amplifying a difference between the input signal IN and the reference signal VREF by using a power supply voltage VCCQ. The reference signal VREF may be set in advance in accordance with the level of the power supply voltage VCCQ. The reference signal VREF may have about half the level of the power supply voltage VCCQ, for example.

The differential amplifier circuit 20 receives the input signal IN and the reference signal VREF by a pair of transistors Tr9 and Tr10, respectively, which form a differential pair, and generates a differential signal VO20 by amplifying a difference between the input signal IN and the reference signal VREF by using the power supply voltage VCCQ.

The level shifter 40 receives the differential signal VO10 from the differential amplifier circuit 10 and receives the differential signal VO20 from the differential amplifier circuit 20. The level shifter 40 shifts the level of the differential signal VO10 and the level of the differential signal VO20 by using a power supply voltage VDDC and transfers the differential signal VO10 and the differential signal VO20 to the output circuit 30. The level of the power supply voltage VDDC is different from the level of the power supply voltage VCCQ and may be set at a level lower than the level of the power supply voltage VCCQ, for instance. The power supply voltage VDDC is a power supply voltage which is used for an operation in the latter part of the semiconductor device 1, for example. The output circuit 30 combines the transferred differential signal VO10 and differential signal VO20 by using the power supply voltage VDDC, generates the output signal OUT commensurate with the resultant signal, and outputs the output signal OUT.

The differential amplifier circuit 10 includes a differential circuit DIFF1, a load circuit LD1, an assist circuit AS11, an assist circuit AS12, a transfer circuit TR11, and a transfer circuit TR12. The differential circuit DIFF1 is disposed between the load circuit LD1 and the power supply potential VCCQ. The load circuit LD1 is disposed between the differential circuit DIFF1 and a ground potential. A location in which the assist circuit AS11 is disposed is between the differential circuit DIFF1 and the transfer circuit TR11 and between the load circuit LD1 and the transfer circuit TR11. A location in which the assist circuit AS12 is disposed is between the differential circuit DIFF1 and the transfer circuit TR12 and between the load circuit LD1 and the transfer circuit TR12.

The transfer circuit TR11 includes a transistor Tr18. The transistor Tr18 may be configured with an NMOS transistor. The gate of the transistor Tr18 is connected to the assist circuit AS11 via a bias line VREFBN. The drain of the transistor Tr18 is connected to the level shifter 40 and the source of the transistor Tr18 is connected to the ground potential.

The transfer circuit TR12 includes a transistor Tr5. The transistor Tr5 may be configured with an NMOS transistor. The gate of the transistor Tr5 is connected to the assist circuit AS12 via a bias line INBN. The drain of the transistor Tr5 is connected to the level shifter 40 and the source of the transistor Tr5 is connected to the ground potential.

The differential circuit DIFF1 includes the transistor Tr1, the transistor Tr2, and a current source CS1. The transistor Tr1 and the transistor Tr2 form a differential pair. Each of the transistor Tr1 and the transistor Tr2 may be configured with a PMOS transistor. The transistor Tr1 receives the input signal IN at the gate, the drain of the transistor Tr1 is electrically connected to a node N11, and the source of the transistor Tr1 is electrically connected to one end of the current source CS1. The transistor Tr2 receives the reference signal VREF at the gate, the drain of the transistor Tr2 is electrically connected to a node N12, and the source of the transistor Tr2 is electrically connected to the one end of the current source CS1. The other end of the current source CS1 is electrically connected to the power supply potential VCCQ.

The load circuit LD1 includes a transistor Tr21 and a transistor Tr22. Each of the transistor Tr21 and the transistor Tr22 may be configured with an NMOS transistor. The transistor Tr21 receives a predetermined bias voltage VBN at the gate, the drain of the transistor Tr21 is electrically connected to the node N11, and the source of the transistor Tr21 is electrically connected to the ground potential. The transistor Tr22 receives the predetermined bias voltage VBN at the gate, the drain of the transistor Tr22 is electrically connected to the node N12, and the source of the transistor Tr22 is electrically connected to the ground potential.

The assist circuit AS11 includes a transistor Tr3, a transistor Tr19, a transistor Tr20, and a current source CS3. Each of the transistor Tr3, the transistor Tr19, and the transistor Tr20 may be configured with an NMOS transistor. The transistor Tr3 is disposed between the transistor Tr1 and the ground potential. The transistor Tr3 is connected in series with the transistor Tr1. The transistor Tr3 is diode-connected and forms a current mirror circuit with the transistor Tr18. The gate of the transistor Tr3 is connected to the bias line VREFBN and the drain of the transistor Tr3. One end of the current source CS3 is connected to the bias line VREFBN. The other end of the current source CS3 is connected to the power supply potential VCCQ. As a result, for the drain current of the transistor Tr3, a drain current commensurate with a mirror ratio, which is determined by the ratio between the dimension (=W/L, W: gate width, L: gate length) of the transistor Tr3 and the dimension of the transistor Tr18, appears on the drain side of the transistor Tr18.

Between the drain of the transistor Tr3 and the ground potential, the transistor Tr19 and the transistor Tr20 are connected in series with each other and in parallel with the transistor Tr3. The transistor Tr19 is diode-connected and forms a current mirror circuit with the transistor Tr18. The gate of the transistor Tr19 is connected to the bias line VREFBN, the drain of the transistor Tr19 is connected to the gate and the drain of the transistor Tr3, and the source of the transistor Tr19 is connected to the drain of the transistor Tr20 via the node N11. The transistor Tr20 receives the input signal IN at the gate, the drain of the transistor Tr20 is connected to the source of the transistor Tr19 via the node N11, and the source of the transistor Tr20 is connected to the ground potential.

That is, the transistor Tr3 itself is diode-connected and, in addition thereto, the transistor Tr3 is diode-connected via the transistor Tr19. As a result, the mirror ratio of the drain current of the transistor Tr18 to the drain current of the transistor Tr3 can be changed in accordance with the level of the input signal IN, which the transistor Tr20 receives at the gate.

The assist circuit AS12 has a configuration which is nearly symmetrical to the configuration of the assist circuit AS11. However, the assist circuit AS12 differs from the assist circuit AS11 in that the assist circuit AS12 includes a discharge circuit DIS11 and a discharge circuit DIS12. The discharge circuit DIS11 forms a discharge path between the node N12, which is an intermediate node in the assist circuit AS12, and the ground potential in accordance with the potential of the bias line INBN, and discharges a charge at the node N12. The discharge circuit DIS12 forms a discharge path between the node N12, which is an intermediate node in the assist circuit AS12, and the ground potential in accordance with the reference signal VREF, and discharges a charge at the node N12.

The assist circuit AS12 includes a transistor Tr4, a transistor Tr6, a transistor Tr7, a transistor Tr8, a transistor Tr17, and a current source CS2. Each of the transistor Tr4, the transistor Tr6, the transistor Tr7, the transistor Tr8, and the transistor Tr17 may be configured with an NMOS transistor. The transistor Tr4 is disposed between the transistor Tr2 and the ground potential. The transistor Tr4 is connected in series with the transistor Tr2. The transistor Tr4 is diode-connected and forms a current mirror circuit with the transistor Tr5. The gate of the transistor Tr4 is connected to the bias line INBN and the drain of the transistor Tr4. One end of the current source CS2 is connected to the bias line INBN. The other end of the current source CS2 is connected to the power supply potential VCCQ. As a result, for the drain current of the transistor Tr4, a drain current commensurate with a mirror ratio, which is determined by the ratio between the dimension of the transistor Tr4 and the dimension of the transistor Tr5, appears on the drain side of the transistor Tr5.

Between the drain of the transistor Tr4 and the ground potential, the transistor Tr6 and the transistor Tr7 are connected in series with each other and in parallel with the transistor Tr4. The transistor Tr6 is diode-connected and forms a current mirror circuit with the transistor Tr5. The gate of the transistor Tr6 is connected to the bias line INBN, the drain of the transistor Tr6 is connected to the gate and the drain of the transistor Tr4, and the source of the transistor Tr6 is connected to the drain of the transistor Tr7 via the node N12. The gate of the transistor Tr7 is connected to the bias line INBN, the drain of the transistor Tr7 is connected to the source of the transistor Tr6 via the node N12, and the source of the transistor Tr7 is connected to the ground potential.

That is, the transistor Tr4 itself is diode-connected and, in addition thereto, the transistor Tr4 is diode-connected via the transistor Tr6. As a result, the mirror ratio of the drain current of the transistor Tr5 to the drain current of the transistor Tr4 can be changed in accordance with a potential level VINBN of the bias line INBN, which the transistor Tr7 receives at the gate. The potential level VINBN of the bias line INBN may be adjusted to a level (for example, VREF<VINBN<VCCQ) higher than the level of the reference signal VREF by the action of the current source CS2.

Moreover, the discharge circuit DIS11 includes the transistor Tr7 whose gate is connected to the bias line INBN, and discharges a charge at the node N12, which is an intermediate node in the assist circuit AS12, in accordance with the potential of the bias line INBN. As a result, when the level of the power supply voltage VCCQ is low, even when the amplitude of the input signal IN becomes small in response thereto, the discharge circuit DIS11 can turn on the transistor Tr7 in a timing with which the node N12 has to be discharged. For instance, the discharge circuit DIS11 can form a discharge path between the node N12 and the ground potential by turning on the transistor Tr7 in a timing with which the input signal IN transitions from an L level to an H level. As a result, the discharge circuit DIS11 can appropriately discharge a charge at the node N12.

Between the node N12 and the ground potential, the transistor Tr8 and the transistor Tr17 are connected in series with each other and in parallel with the transistor Tr7. The transistor Tr8 receives the reference signal VREF at the gate, the drain of the transistor Tr8 is connected to the node N12, and the source of the transistor Tr8 is connected to the drain of the transistor Tr17. The gate of the transistor Tr17 is connected to the power supply potential VCCQ, the drain of the transistor Tr17 is connected to the source of the transistor Tr8, and the source of the transistor Tr17 is connected to the ground potential.

That is, the discharge circuit DIS12 includes a series connection of the transistor Tr8 that receives the reference signal VREF at the gate and the transistor Tr17 whose gate is connected to the power supply potential VCCQ, and discharges a charge at the node N12, which is an intermediate node in the assist circuit AS12, in accordance with the reference signal VREF. As a result, the discharge circuit DIS12 operates in an auxiliary manner so as to make up for lack of discharge capacity of the discharge circuit DIS11 when the level of the power supply voltage VCCQ is relatively high, and can discharge a charge at the node N12 by forming a discharge path between the node N12 and the ground potential. In other words, the discharge circuit DIS12 can appropriately discharge a charge at the node N12 in accordance with the level of the power supply voltage VCCQ.

The differential amplifier circuit 20 includes a differential circuit DIFF2, a load circuit LD2, an assist circuit AS21, an assist circuit AS22, a transfer circuit TR21, and a transfer circuit TR22. The differential circuit DIFF2 is disposed between the load circuit LD2 and the ground potential. The load circuit LD2 is disposed between the differential circuit DIFF2 and the power supply potential VCCQ. A location in which the assist circuit AS21 is disposed is between the differential circuit DIFF2 and the transfer circuit TR21 and between the load circuit LD2 and the transfer circuit TR21. A location in which the assist circuit AS22 is disposed is between the differential circuit DIFF2 and the transfer circuit TR22 and between the load circuit LD2 and the transfer circuit TR22.

The transfer circuit TR21 includes a transistor Tr24. The transistor Tr24 may be configured with a PMOS transistor. The gate of the transistor Tr24 is connected to the assist circuit AS21 via a bias line INB. The drain of the transistor Tr24 is connected to the level shifter 40 and the source of the transistor Tr24 is connected to the power supply potential VCCQ.

The transfer circuit TR22 includes a transistor Tr13. The transistor Tr13 may be configured with a PMOS transistor. The gate of the transistor Tr13 is connected to the assist circuit AS22 via a bias line VREFB. The drain of the transistor Tr13 is connected to the level shifter 40 and the source of the transistor Tr13 is connected to the power supply potential VCCQ.

The differential circuit DIFF2 includes the transistor Tr9, the transistor Tr10, and a current source CS4. The transistor Tr9 and the transistor Tr10 form a differential pair. Each of the transistor Tr9 and the transistor Tr10 can be configured with an NMOS transistor. The transistor Tr9 receives the input signal IN at the gate, the drain of the transistor Tr9 is electrically connected to a node N21, and the source of the transistor Tr9 is electrically connected to one end of the current source CS4. The transistor Tr10 receives the reference signal VREF at the gate, the drain of the transistor Tr10 is electrically connected to a node N22, and the source of the transistor Tr10 is electrically connected to the one end of the current source CS4. The other end of the current source CS4 is electrically connected to the ground potential.

The load circuit LD2 includes a transistor Tr27 and a transistor Tr28. Each of the transistor Tr27 and the transistor Tr28 may be configured with a PMOS transistor. The transistor Tr27 receives a predetermined bias voltage VBP at the gate, the drain of the transistor Tr27 is electrically connected to the node N21, and the source of the transistor Tr27 is electrically connected to the power supply potential VCCQ. The transistor Tr28 receives the predetermined bias voltage VBP at the gate, the drain of the transistor Tr28 is electrically connected to the node N22, and the source of the transistor Tr28 is electrically connected to the power supply potential VCCQ.

The assist circuit AS21 includes a transistor Tr11, a transistor Tr25, a transistor Tr26, and a current source CS5. Each of the transistor Tr11, the transistor Tr25, and the transistor Tr26 may be configured with a PMOS transistor. The transistor Tr11 is disposed between the transistor Tr9 and the power supply potential VCCQ. The transistor Tr11 is connected in series with the transistor Tr9. The transistor Tr11 is diode-connected and forms a current mirror circuit with the transistor Tr24. The gate of the transistor Tr11 is connected to the bias line INB and the drain of the transistor Tr11. One end of the current source CS5 is connected to the bias line INB. The other end of the current source CS5 is connected to the ground potential. As a result, for the drain current of the transistor Tr11, a drain current commensurate with a mirror ratio, which is determined by the ratio between the dimension of the transistor Tr11 and the dimension of the transistor Tr24, appears on the drain side of the transistor Tr24.

Between the drain of the transistor Tr11 and the power supply potential VCCQ, the transistor Tr25 and the transistor Tr26 are connected in series with each other and in parallel with the transistor Tr11. The transistor Tr25 is diode-connected and forms a current mirror circuit with the transistor Tr24. The gate of the transistor Tr25 is connected to the bias line INB, the drain of the transistor Tr25 is connected to the gate and the drain of the transistor Tr11, and the source of the transistor Tr25 is connected to the drain of the transistor Tr26 via the node N21. The transistor Tr26 receives the input signal IN at the gate, the drain of the transistor Tr26 is connected to the source of the transistor Tr25 via the node N21, and the source of the transistor Tr26 is connected to the power supply potential VCCQ.

That is, the transistor Tr11 itself is diode-connected and, in addition thereto, the transistor Tr11 is diode-connected via the transistor Tr25. As a result, the mirror ratio of the drain current of the transistor Tr24 to the drain current of the transistor Tr11 can be changed in accordance with the level of the input signal IN which the transistor Tr26 receives at the gate.

The assist circuit AS22 has a configuration which is nearly symmetrical to the configuration of the assist circuit AS21; however, the assist circuit AS22 differs from the assist circuit AS21 in that the assist circuit AS22 includes a discharge circuit DIS21 and a discharge circuit DIS22. The discharge circuit DIS21 forms a discharge path between the node N22, which is an intermediate node in the assist circuit AS22, and the ground potential in accordance with the potential of the bias line VREFB, and discharges a charge at the node N22. The discharge circuit DIS22 forms a discharge path between the node N22, which is an intermediate node in the assist circuit AS22, and the ground potential in accordance with the reference signal VREF, and discharges a charge at the node N22.

The assist circuit AS22 includes a transistor Tr12, a transistor Tr14, a transistor Tr15, a transistor Tr16, a transistor Tr23, and a current source CS6. Each of the transistor Tr12, the transistor Tr14, the transistor Tr15, the transistor Tr16, and the transistor Tr23 may be configured with a PMOS transistor. The transistor Tr12 is disposed between the transistor Tr10 and the power supply potential VCCQ. The transistor Tr12 is connected in series with the transistor Tr10. The transistor Tr12 is diode-connected and forms a current mirror circuit with the transistor Tr13. The gate of the transistor Tr12 is connected to the bias line VREFB and the drain of the transistor Tr12. One end of the current source CS6 is connected to the bias line VREFB. The other end of the current source CS6 is connected to the ground potential. As a result, for the drain current of the transistor Tr12, a drain current commensurate with a mirror ratio, which is determined by the ratio between the dimension of the transistor Tr12 and the dimension of the transistor Tr13, appears on the drain side of the transistor Tr13.

Between the drain of the transistor Tr12 and the power supply potential VCCQ, the transistor Tr14 and the transistor Tr15 are connected in series with each other and in parallel with the transistor Tr12. The transistor Tr14 is diode-connected and forms a current mirror circuit with the transistor Tr13. The gate of the transistor Tr14 is connected to the bias line VREFB, the drain of the transistor Tr14 is connected to the gate and the drain of the transistor Tr12, and the source of the transistor Tr14 is connected to the drain of the transistor Tr15 via the node N22. The gate of the transistor Tr15 is connected to the bias line VREFB, the drain of the transistor Tr15 is connected to the source of the transistor Tr14 via the node N22, and the source of the transistor Tr15 is connected to the power supply potential VCCQ.

That is, the transistor Tr12 itself is diode-connected and, in addition thereto, the transistor Tr12 is diode-connected via the transistor Tr14. As a result, the mirror ratio of the drain current of the transistor Tr13 to the drain current of the transistor Tr12 can be changed in accordance with the level of the reference signal VREF which the transistor Tr15 receives at the gate.

Moreover, the discharge circuit DIS21 includes the transistor Tr15 whose gate is connected to the bias line VREFB, and discharges a charge at the node N22, which is an intermediate node in the assist circuit AS22, in accordance with the potential of the bias line VREFB. As a result, when the level of the power supply voltage VCCQ is low, even when the amplitude of the input signal IN becomes small in response thereto, the discharge circuit DIS21 can form a discharge path between the node N22 and the ground potential by turning on the transistor Tr15 in a timing with which the node N22 has to be discharged. For instance, the discharge circuit DIS21 can form a discharge path between the node N22 and the ground potential by turning on the transistor Tr15 in a timing with which the input signal IN transitions from an L level to an H level. As a result, the discharge circuit DIS21 can appropriately discharge a charge at the node N22.

Between the node N22 and the power supply potential VCCQ, the transistor Tr16 and the transistor Tr23 are connected in series with each other and in parallel with the transistor Tr15. The transistor Tr16 receives the reference signal VREF at the gate, the drain of the transistor Tr16 is connected to the node N22, and the source of the transistor Tr16 is connected to the drain of the transistor Tr23. The gate of the transistor Tr23 is connected to the ground potential, the drain of the transistor Tr23 is connected to the source of the transistor Tr16, and the source of the transistor Tr23 is connected to the power supply potential VCCQ.

That is, the discharge circuit DIS22 includes a series connection of the transistor Tr16 that receives the reference signal VREF at the gate and the transistor Tr23 whose gate is connected to the ground potential, and discharges a charge at the node N22, which is an intermediate node in the assist circuit AS22, in accordance with the reference signal VREF. As a result, the discharge circuit DIS22 operates in an auxiliary manner so as to make up for lack of discharge capacity of the discharge circuit DIS21 when the level of the power supply voltage VCCQ is relatively high, and can discharge a charge at the node N22 by forming a discharge path between the node N22 and the ground potential. In other words, the discharge circuit DIS22 can appropriately discharge a charge at the node N22 in accordance with the level of the power supply voltage VCCQ.

The level shifter 40 includes a transistor Tr25, a transistor Tr26, a capacitive element C1, and a capacitive element C2. The gates of the transistor Tr25 and the transistor Tr26 are connected to each other via a bias line VREFB4, and the transistor Tr25 and the transistor Tr26 form a current mirror circuit. Each of the transistor Tr25 and the transistor Tr26 may be configured with a PMOS transistor. The drain of the transistor Tr25 is connected to the drain of the transistor Try. The drain of the transistor Tr26 is connected to the drain of the transistor Tr18. One end of the capacitive element C1 is connected to the bias line INBN and the other end of the capacitive element C1 is connected to one end of the capacitive element C2. The one end of the capacitive element C2 is connected to the other end of the capacitive element C1 and the other end of the capacitive element C2 is connected to the bias line VREFB4.

In accordance with a signal (a current) which is transferred to a node N31 from the transfer circuit TR12 and a signal (a current) which is transferred to the node N31 from the transfer circuit TR11 via the current mirror circuit formed of the transistor Tr25 and the transistor Tr26, the differential signal (the voltage) VO10 from the differential amplifier circuit 10 appears at the node N31.

Likewise, in accordance with a signal (a current) which is transferred to a node N32 from the transfer circuit TR22 via the transfer circuit TR11, the transistor Tr26, and the capacitive element C2 and a signal (a current) which is transferred to the node N32 from the transfer circuit TR21 via the capacitive element C1, the differential signal (the voltage) VO20 from the differential amplifier circuit 20 appears at the node N32.

The output circuit 30 is disposed between the level shifter 40 and a node $N_{OUT}$. The output circuit 30 is connected between the nodes N31 and N32 and the node $N_{OUT}$. The node N31 and the node N32 each function as an input node of the output circuit 30. The node $N_{OUT}$ functions as an output node of the output circuit 30 and functions as an output node of the semiconductor device 1.

The output circuit 30 includes a plurality of inverters IV1, IV2, IV3, and IV4. The input node of the inverter IV1 is connected to the node N31 and the output node of the inverter IV1 is connected to the inverter IV2. The input node of the inverter IV2 is connected to the inverter IV1 and the output node of the inverter IV2 is connected to the inverter IV3. The input node of the inverter IV3 is connected to the inverter IV2 and the output node of the inverter IV3 is connected to the node $N_{OUT}$. The input node of the inverter IV4 is connected to the node N31 and the output node of the inverter IV4 is connected to the node N32. With this configuration, the output circuit 30 combines the differential signal VO10 and the differential signal VO20, generates the output signal OUT in accordance with the resultant signal, and outputs the output signal OUT.

As described above, in the first embodiment, in the differential amplifier circuits 10 and 20 of the semiconductor device 1, the circuits DIS11, DIS12, DIS21, and DIS22, each being capable of forming a discharge path from the intermediate node N12 or N22, are provided in the assist circuits AS12 and AS22 on the reference signal side. As a result, in the semiconductor device 1, the range of the power supply voltage VCCQ in which the differential amplifier circuits 10 and 20 can operate properly can be extended.

Second Embodiment

Next, a semiconductor device according to a second embodiment will be described. Hereinafter, a portion of the semiconductor device according to the second embodiment differs from the semiconductor device according to the first embodiment will be described.

In the discharge circuits DIS12 and DIS22 depicted in FIG. 1, the transistors Tr17 and Tr23, each receiving the power supply voltage VCCQ at the gate, function as switches. That is, as a result of the transistors Tr17 and Tr23 being turned off when the level of the power supply voltage VCCQ is low and turned on when the level of the power supply voltage VCCQ is high, the discharge circuits DIS12 and DIS22 can be selectively activated when the level of the power supply voltage VCCQ is high.

Alternatively, in the discharge circuits DIS12 and DIS22, the transistors Tr8 and Tr16 themselves, each receiving the reference signal VREF at the gate, may also function as switches. For instance, when the reference signal VREF may be set in advance in accordance with the level of the power supply voltage VCCQ (for example, VREF≈VCCQ×½), the transistors Tr8 and Tr16 may be turned off when the level of the power supply voltage VCCQ is low and the transistors Tr8 and Tr16 may be turned on when the level of the power supply voltage VCCQ is high.

Figure 2:
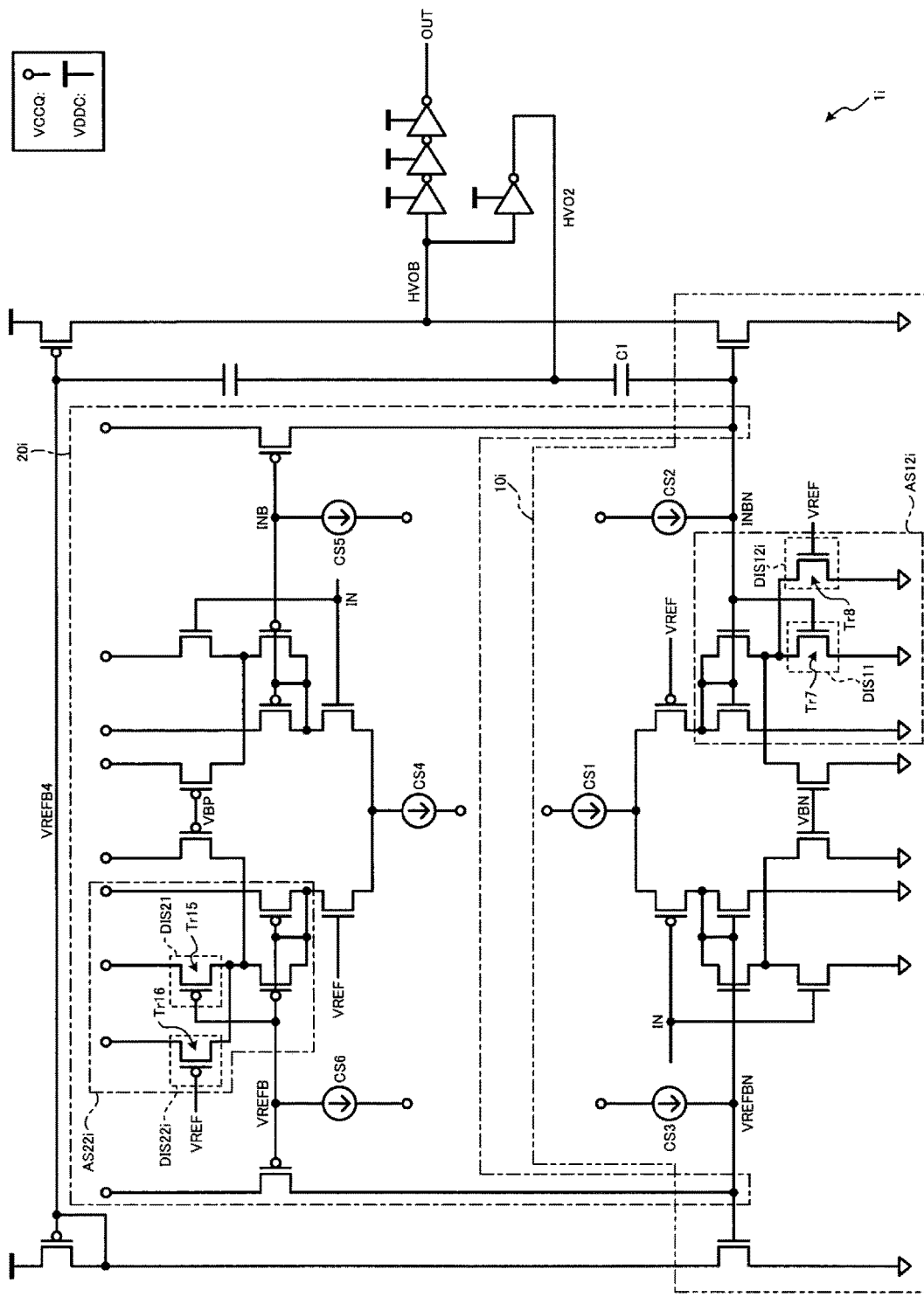
FIG. 2 is a circuit diagram depicting the configuration of a semiconductor device according to a second embodiment.

Based on this concept, a semiconductor device 1$i$ according to the second embodiment may be configured as depicted in FIG. 2. FIG. 2 is a circuit diagram depicting the configuration of the semiconductor device 1$i$ according to the second embodiment. The semiconductor device 1$i$ includes a differential amplifier circuit 10$i$ and a differential amplifier circuit 20$i$ instead of the differential amplifier circuit 10 and the differential amplifier circuit 20 (see FIG. 1).

The differential amplifier circuit 10*i* includes an assist circuit AS12*i*. The assist circuit AS12*i* includes a discharge circuit DIS12*i*. The discharge circuit DIS12*i* differs from the discharge circuit DIS12 (see FIG. 1) of the first embodiment in that the transistor Tr17 is omitted. As a result, the configuration of the discharge circuit DIS12*i* can be simplified.

Likewise, the differential amplifier circuit 20*i* includes an assist circuit AS22*i*. The assist circuit AS22*i* includes a discharge circuit DIS22*i*. The discharge circuit DIS22*i* differs from the discharge circuit DIS22 (see FIG. 1) of the first embodiment in that the transistor Tr23 is omitted. As a result, the configuration of the discharge circuit DIS22*i* can be simplified.

As described above, in the second embodiment, the configurations of the assist circuits AS12*i* and AS22*i* on the reference signal side in the differential amplifier circuits 10*i* and 20*i* of the semiconductor device 1*i* can be simplified and the cost of the semiconductor device 1*i* can be easily reduced.

Third Embodiment

Next, a semiconductor device according to a third embodiment will be described. Hereinafter, a portion of the semiconductor device according to the third embodiment differs from the semiconductor devices according to the first and second embodiments will be described.

When an assist circuit is not provided in the differential amplifier circuit, the differential amplifier circuit sometimes becomes less operable when the power supply voltage becomes low. For example, if a charge remains at an intermediate node of the differential circuit and the load circuit in the differential amplifier circuit, this may cause deterioration of the duty ratio of the output signal. In this case, by making improvements so that the differential amplifier circuit can operate even at a low power supply voltage, extending the range of the power supply voltage in which the differential amplifier circuit can operate properly is desirable.

Thus, in the third embodiment, by providing, in the differential amplifier circuit of the semiconductor device, a circuit that can form a discharge path from an intermediate node of the differential circuit and the load circuit, the range of the power supply voltage in which the differential amplifier circuit can operate properly is extended.

Figure 3:
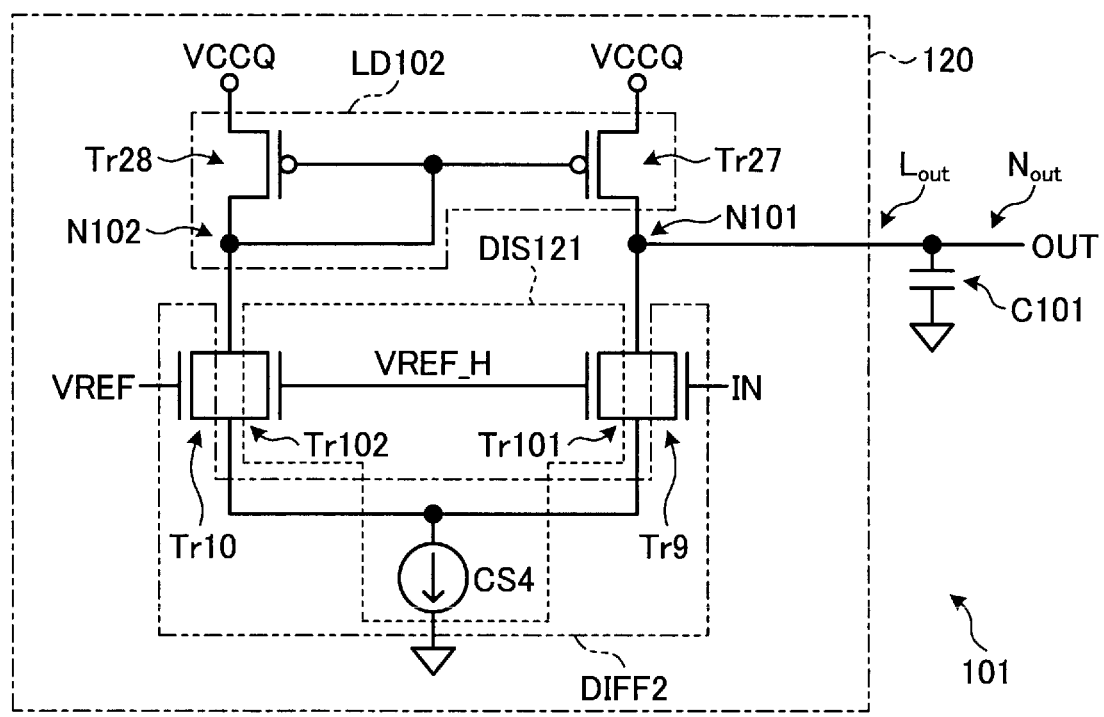
FIG. 3 is a circuit diagram depicting the configuration of a semiconductor device according to a third embodiment.

Specifically, a semiconductor device 101 may be configured as depicted in FIG. 3. FIG. 3 is a circuit diagram depicting the configuration of the semiconductor device 101 according to the third embodiment.

The semiconductor device 101 makes a single-input single-output circuit possible by using one differential amplifier circuit. The semiconductor device 101 receives the input signal IN as a single input, converts the input signal IN into a differential signal and performs amplification processing on the differential signal, and generates the output signal OUT from the processed differential signal and outputs the output signal OUT as a single output.

The semiconductor device 101 includes a differential amplifier circuit 120. The differential amplifier circuit 120 receives the input signal IN and the reference signal VREF by a pair of the transistors Tr9 and Tr10, respectively, which form a differential pair, and generates a differential signal by amplifying a difference between the input signal IN and the reference signal VREF by using the power supply voltage VCCQ. An intermediate node N101 between the differential circuit DIFF2 and a load circuit LD102 in the differential amplifier circuit 120 is connected to the output node $N_{out}$ of the semiconductor device 101 via an output line $L_{out}$. The output line $L_{out}$ includes a capacitive component C101 as parasitic capacitance. In the semiconductor device 101, the potential of the intermediate node N101 on the output side varies by the differential signal generated in the differential amplifier circuit 120, whereby the capacitive component C101 is charged and discharged, and the output signal OUT is output from the output node $N_{out}$ in accordance with the potential which is held in the capacitive component C101.

The differential amplifier circuit 120 includes the differential circuit DIFF2, the load circuit LD102, and a discharge circuit DIS121. The differential circuit DIFF2 is disposed between the load circuit LD102 and the ground potential in parallel with the discharge circuit DIS121. The discharge circuit DIS121 is disposed between the load circuit LD102 and the ground potential in parallel with the differential circuit DIFF2. The load circuit LD102 is disposed between the differential circuit DIFF2 and the power supply potential VCCQ.

The differential circuit DIFF2 includes the transistor Tr9, the transistor Tr10, and the current source CS4. The transistor Tr9 and the transistor Tr10 form a differential pair. Each of the transistor Tr9 and the transistor Tr10 may be configured with an NMOS transistor. The transistor Tr9 receives the input signal IN at the gate, the drain of the transistor Tr9 is electrically connected to the node N101, and the source of the transistor Tr9 is electrically connected to one end of the current source CS4. The transistor Tr10 receives the reference signal VREF at the gate, the drain of the transistor Tr10 is electrically connected to a node N102, and the source of the transistor Tr10 is electrically connected to the one end of the current source CS4. The other end of the current source CS4 is electrically connected to the ground potential.

The load circuit LD102 includes the transistor Tr27 and the transistor Tr28. The transistor Tr28 is diode-connected, the gates of the transistor Tr27 and the transistor Tr28 are connected to each other, and the transistor Tr27 and the transistor Tr28 form a current mirror circuit. Each of the transistor Tr27 and the transistor Tr28 may be configured with a PMOS transistor. The gate of the transistor Tr27 is connected to the gate and the drain of the transistor Tr28, the drain of the transistor Tr27 is electrically connected to the node N101, and the source of the transistor Tr27 is electrically connected to the power supply potential VCCQ. The gate of the transistor Tr28 is connected to the drain of the transistor Tr28 and the gate of the transistor Tr27, and the drain of the transistor Tr28 is electrically connected to the node N102, and the source of the transistor Tr28 is electrically connected to the power supply potential VCCQ.

The discharge circuit DIS121 includes a transistor Tr101, a transistor Tr102, and the current source CS4. The transistor Tr101 and the transistor Tr102 form a differential pair. Each of the transistor Tr101 and the transistor Tr102 may be configured with an NMOS transistor. The transistor Tr101 receives a reference signal VREF_H for discharge at the gate, the drain of the transistor Tr101 is electrically connected to the node N101, and the source of the transistor Tr101 is electrically connected to the one end of the current source CS4. The transistor Tr102 receives the reference signal VREF_H for discharge at the gate, the drain of the transistor Tr102 is electrically connected to the node N102, and the source of the transistor Tr102 is electrically connected to the one end of the current source CS4. The current source CS4 is shared by the differential circuit DIFF2 and the discharge circuit DIS121.

The level of the reference signal VREF_H for discharge may be set at a level higher than the level of the reference signal VREF. For example, if VREF≈VCCQ×½, the level of the reference signal VREF_H for discharge may be set so as to satisfy the following Formulae (1) and (2).

$$VREF\_H = VREF + \Delta V1 \quad (1)$$

$$0 < \Delta V1 < VCCQ \times \tfrac{1}{2} \quad (2)$$

That is, the discharge circuit DIS121 includes the transistor Tr101 that receives, at the gate, the reference signal VREF_H whose level is higher than the level of the reference signal VREF, and discharges a charge at the intermediate node N101 on the output side in the differential amplifier circuit 120 in accordance with the level of the reference signal VREF_H. As a result, when the level of the power supply voltage VCCQ is low, even when the amplitude of the input signal IN becomes small in response thereto, the discharge circuit DIS121 can form a discharge path between the intermediate node N101 and the ground potential (via the current source CS4) by turning on the transistor Tr101 in a timing with which the intermediate node N101 has to be discharged. For instance, the discharge circuit DIS121 can form a discharge path between the intermediate node N101 and the ground potential by turning on the transistor Tr101 in a timing with which the input signal IN transitions from an L level to an H level. As a result, the discharge circuit DIS121 can appropriately discharge a charge at the intermediate node N101.

As described above, in the third embodiment, in the differential amplifier circuit 120 of the semiconductor device 101, the circuit DIS121 that can form a discharge path from the intermediate node N101 is provided in parallel with the differential circuit DIFF2. As a result, in the semiconductor device 101, the range of the power supply voltage VCCQ in which the differential amplifier circuit 120 can operate properly can be extended.

Instead of applying the concept behind the third embodiment to a differential amplifier circuit (for example, the differential amplifier circuit 120 depicted in FIG. 3) corresponding to the differential amplifier circuit 20 (see FIG. 1), the concept behind the third embodiment may be applied to a differential amplifier circuit corresponding to the differential amplifier circuit 10 (see FIG. 1). Alternatively, in addition to being applied to a differential amplifier circuit corresponding to the differential amplifier circuit 20 (see FIG. 1), the concept behind the third embodiment may be applied to a differential amplifier circuit corresponding to the differential amplifier circuit 10 (see FIG. 1).

Fourth Embodiment

Next, a semiconductor device according to a fourth embodiment will be described. Hereinafter, a portion of the semiconductor device according to the fourth embodiment differs from the semiconductor devices according to the first to third embodiments will be described.

A circuit (a cross-coupled circuit) in which the gate of one of two transistors is coupled to the drain of the other and the gate of the other is coupled to the drain of the one of the two transistors is sometimes provided in the differential amplifier circuit. The cross-coupled circuit can prevent an amplitude caused by fluctuations in the potential of an intermediate node of the differential circuit and the load circuit.

However, in this configuration, if a charge remains at an intermediate node of the differential circuit and the load circuit in the differential amplifier circuit, this may cause deterioration of the duty ratio of the output signal. In this case, by making improvements so that the differential amplifier circuit can operate even at a low power supply voltage, extending the range of the power supply voltage in which the differential amplifier circuit can operate properly is desirable.

Thus, in the fourth embodiment, by providing, in the differential amplifier circuit of the semiconductor device, a circuit that can form a discharge path from an intermediate node of the differential circuit and the load circuit, the range of the power supply voltage in which the differential amplifier circuit can operate properly is extended.

Figure 4:
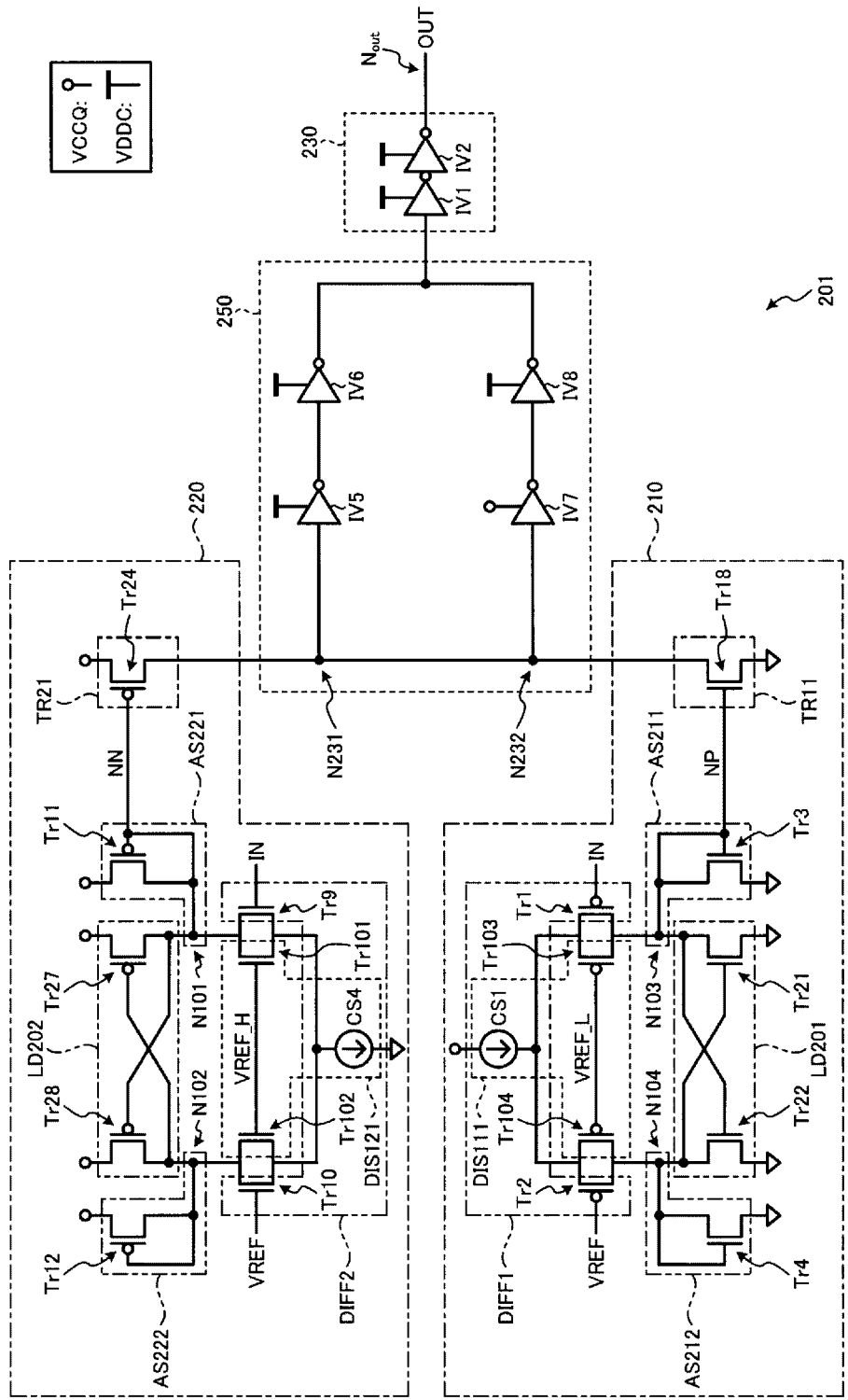
FIG. 4 is a circuit diagram depicting the configuration of a semiconductor device according to a fourth embodiment.

Specifically, a semiconductor device 201 may be configured as depicted in FIG. 4. FIG. 4 is a circuit diagram depicting the configuration of the semiconductor device 201 according to the fourth embodiment.

The semiconductor device 201 includes a differential amplifier circuit 210, a differential amplifier circuit 220, a level shifter 250, and an output circuit 230. The differential amplifier circuit 210 and the differential amplifier circuit 220 are disposed in parallel with each other on the input side of the level shifter 250. A location in which the level shifter 250 is disposed is between the differential amplifier circuit 210 and the output circuit 230 and between the differential amplifier circuit 220 and the output circuit 230.

The differential amplifier circuit 210 receives the input signal IN and the reference signal VREF by a pair of the transistors Tr1 and Tr2, respectively, which form a differential pair, and generates a differential signal by amplifying a difference between the input signal IN and the reference signal VREF by using the power supply voltage VCCQ.

The differential amplifier circuit 220 receives the input signal IN and the reference signal VREF by a pair of the transistors Tr9 and Tr10, respectively, which form a differential pair, and generates a differential signal by amplifying a difference between the input signal IN and the reference signal VREF by using the power supply voltage VCCQ.

The level shifter 250 receives the differential signals from the differential amplifier circuit 210 and the differential amplifier circuit 220, shifts the levels of the differential signals by using the power supply voltage VCCQ and the power supply voltage VDDC, and transfers the differential signals to the output circuit 230. The power supply voltage VDDC is a power supply voltage (for example, a power supply voltage whose level is lower than the level of the power supply voltage VCCQ) whose level is different from the level of the power supply voltage VCCQ. The output circuit 230 generates the output signal OUT commensurate with the transferred differential signals for outputting by using the power supply voltage VDDC.

The differential amplifier circuit 210 includes the differential circuit DIFF1, a load circuit LD201, a discharge circuit DIS111, an assist circuit AS211, an assist circuit AS212, and the transfer circuit TR11. Between the load circuit LD201 and the power supply potential VCCQ, the differential circuit DIFF1 is disposed in parallel with the discharge circuit DIS111. Between the load circuit LD201 and the power supply potential VCCQ, the discharge circuit DIS111 is disposed in parallel with the differential circuit DIFF1. The load circuit LD201 is disposed between the differential circuit DIFF1 and the ground potential. The load circuit LD201 is configured with a circuit (a cross-coupled circuit) in which the gate of one of two transistors is coupled to the drain of the other and the gate of the other is coupled to the drain of the one of the two transistors.

The transfer circuit TR11 includes the transistor Tr18. The transistor Tr18 may be configured with an NMOS transistor.

The gate of the transistor Tr18 is connected to the assist circuit AS211 via a bias line NP. The drain of the transistor Tr18 is connected to the level shifter 250 and the source of the transistor Tr18 is connected to the ground potential.

The differential circuit DIFF1 includes the transistor Tr1, the transistor Tr2, and the current source CS1. The transistor Tr1 and the transistor Tr2 form a differential pair. Each of the transistor Tr1 and the transistor Tr2 can be configured with a PMOS transistor. The transistor Tr1 receives the input signal IN at the gate, the drain of the transistor Tr1 is electrically connected to a node N103, and the source of the transistor Tr1 is electrically connected to one end of the current source CS1. The transistor Tr2 receives the reference signal VREF at the gate, the drain of the transistor Tr2 is electrically connected to a node N104, and the source of the transistor Tr2 is electrically connected to the one end of the current source CS1. The other end of the current source CS1 is electrically connected to the power supply potential VCCQ.

The load circuit LD201 includes the transistor Tr21 and the transistor Tr22. The gate of one of the transistor Tr21 and the transistor Tr22 is coupled to the drain of the other and the gate of the other is coupled to the drain of the one of the transistor Tr21 and the transistor Tr22. Each of the transistor Tr21 and the transistor Tr22 may be configured with an NMOS transistor. The gate of the transistor Tr21 is connected to the drain of the transistor Tr22, the drain of the transistor Tr21 is electrically connected to the node N103, and the source of the transistor Tr21 is electrically connected to the ground potential. The gate of the transistor Tr22 is connected to the drain of the transistor Tr21, the drain of the transistor Tr22 is electrically connected to the node N104, and the source of the transistor Tr22 is electrically connected to the ground potential.

The assist circuit AS211 includes the transistor Tr3. The transistor Tr3 may be configured with an NMOS transistor. The transistor Tr3 is disposed between the transistor Tr1 and the ground potential. The transistor Tr3 is connected in series with the transistor Tr1. The transistor Tr3 is diode-connected and forms a current mirror circuit with the transistor Tr18. The gate of the transistor Tr3 is connected to the bias line NP and the drain of the transistor Tr3. The drain of the transistor Tr3 is connected to the node N103. As a result, for the drain current of the transistor Tr3 (that is, the current flowing through the node N103), a drain current commensurate with a mirror ratio, which is determined by the ratio between the dimension of the transistor Tr3 and the dimension of the transistor Tr18, appears on the drain side of the transistor Tr18.

The assist circuit AS212 includes the transistor Tr4. The transistor Tr4 may be configured with an NMOS transistor. The transistor Tr4 is disposed between the transistor Tr2 and the ground potential. The transistor Tr4 is connected in series with the transistor Tr2. The gate of the transistor Tr4 is connected to the drain of the transistor Tr4. The drain of the transistor Tr4 is connected to the node N104.

The discharge circuit DIS111 includes a transistor Tr103, a transistor Tr104, and the current source CS1. The transistor Tr103 and the transistor Tr104 form a differential pair. Each of the transistor Tr103 and the transistor Tr104 may be configured with a PMOS transistor. The transistor Tr103 receives a reference signal VREF_L for discharge at the gate, the drain of the transistor Tr103 is electrically connected to the node N103, and the source of the transistor Tr103 is electrically connected to the one end of the current source CS1. The transistor Tr104 receives the reference signal VREF_L for discharge at the gate, the drain of the transistor Tr104 is electrically connected to the node N104, and the source of the transistor Tr104 is electrically connected to the one end of the current source CS1. The other end of the current source CS1 is electrically connected to the power supply potential VCCQ. The current source CS1 is shared by the differential circuit DIFF1 and the discharge circuit DIS111.

The level of the reference signal VREF_L for discharge may be set at a level lower than the level of the reference signal VREF. For example, if $VREF \approx VCCQ \times \frac{1}{2}$, the level of the reference signal VREF_L for discharge may be set so as to satisfy the following Formulae (3) and (4).

$$VREF\_L = VREF - \Delta V2 \quad (3)$$

$$0 < \Delta V2 < VCCQ \times \frac{1}{2} \quad (4)$$

$\Delta V2$ in Formulae (3) and (4) may be a value equal to or different from the value of $\Delta V1$ in Formulae (1) and (2).

That is, the discharge circuit DIS111 includes the transistor Tr103 that receives, at the gate, the reference signal VREF_L whose level is lower than the level of the reference signal VREF, and discharges a charge at the intermediate node N103 on the output side in the differential amplifier circuit 210 in accordance with the level of the reference signal VREF_L. As a result, when the level of the power supply voltage VCCQ is low, even when the amplitude of the input signal IN becomes small in response thereto, the discharge circuit DIS111 can form a discharge path between the intermediate node N103 and the power supply potential VCCQ (via the current source CS1) by turning on the transistor Tr103 in a timing with which the intermediate node N103 has to be discharged. For instance, the discharge circuit DIS111 can form a discharge path between the intermediate node N103 and the power supply potential VCCQ by turning on the transistor Tr103 in a timing with which the input signal IN transitions from an H level to an L level. As a result, the discharge circuit DIS111 can appropriately discharge a charge at the intermediate node N103.

The differential amplifier circuit 220 includes the differential circuit DIFF2, a load circuit LD202, the discharge circuit DIS121, an assist circuit AS221, an assist circuit AS222, and the transfer circuit TR21. The differential circuit DIFF2 is disposed between the load circuit LD202 and the ground potential in parallel with the discharge circuit DIS121. The discharge circuit DIS121 is disposed between the load circuit LD202 and the ground potential in parallel with the differential circuit DIFF2. The load circuit LD202 is disposed between the differential circuit DIFF2 and the power supply potential VCCQ. The load circuit LD202 is configured with a circuit (a cross-coupled circuit) in which the gate of one of two transistors is coupled to the drain of the other and the gate of the other is coupled to the drain of the one of the two transistors.

The transfer circuit TR21 includes the transistor Tr24. The transistor Tr24 may be configured with a PMOS transistor. The gate of the transistor Tr24 is connected to the assist circuit AS221 via a bias line NN. The drain of the transistor Tr24 is connected to the level shifter 250 and the source of the transistor Tr24 is connected to the power supply potential VCCQ.

The differential circuit DIFF2 includes the transistor Tr9, the transistor Tr10, and the current source CS4. The transistor Tr9 and the transistor Tr10 form a differential pair. Each of the transistor Tr9 and the transistor Tr10 may be configured with an NMOS transistor. The transistor Tr9 receives the input signal IN at the gate, the drain of the transistor Tr9 is electrically connected to the node N101, and the source of the transistor Tr9 is electrically connected to one end of the current source CS4. The transistor Tr10 receives the reference signal VREF at the gate, the drain of the transistor Tr10 is electrically connected to the node N102, and the source of the transistor Tr10 is electrically connected to the one end of the current source CS4. The other end of the current source CS4 is electrically connected to the ground potential.

The load circuit LD202 includes the transistor Tr27 and the transistor Tr28. The gate of one of the transistor Tr27 and the transistor Tr28 is coupled to the drain of the other and the gate of the other is coupled to the drain of the one of the transistor Tr27 and the transistor Tr28. Each of the transistor Tr27 and the transistor Tr28 may be configured with a PMOS transistor. The gate of the transistor Tr27 is connected to the drain of the transistor Tr28, the drain of the transistor Tr27 is electrically connected to the node N101, and the source of the transistor Tr27 is electrically connected to the power supply potential VCCQ. The gate of the transistor Tr28 is connected to the drain of the transistor Tr27, the drain of the transistor Tr28 is electrically connected to the node N102, and the source of the transistor Tr28 is electrically connected to the power supply potential VCCQ.

The assist circuit AS221 includes the transistor Tr11. The transistor Tr11 may be configured with a PMOS transistor. The transistor Tr11 is disposed between the transistor Tr9 and the power supply potential VCCQ. The transistor Tr11 is connected in series with the transistor Tr9. The transistor Tr11 is diode-connected and forms a current mirror circuit with the transistor Tr24. The gate of the transistor Tr11 is connected to the bias line NN and the drain of the transistor Tr11. The drain of the transistor Tr11 is connected to the node N101. As a result, for the drain current of the transistor Tr11 (that is, the current flowing through the node N101), a drain current commensurate with a mirror ratio, which is determined by the ratio between the dimension of the transistor Tr11 and the dimension of the transistor Tr24, appears on the drain side of the transistor Tr24.

The assist circuit AS222 includes the transistor Tr12. The transistor Tr12 may be configured with a PMOS transistor. The transistor Tr12 is disposed between the transistor Tr10 and the power supply potential VCCQ. The transistor Tr12 is connected in series with the transistor Tr10. The gate of the transistor Tr12 is connected to the drain of the transistor Tr12. The drain of the transistor Tr12 is connected to the node N102.

The discharge circuit DIS121 includes the transistor Tr101, the transistor Tr102, and the current source CS4. The transistor Tr101 and the transistor Tr102 form a differential pair. Each of the transistor Tr101 and the transistor Tr102 may be configured with an NMOS transistor. The transistor Tr101 receives the reference signal VREF_H for discharge at the gate, the drain of the transistor Tr101 is electrically connected to the node N101, and the source of the transistor Tr101 is electrically connected to the one end of the current source CS4. The transistor Tr102 receives the reference signal VREF_H for discharge at the gate, the drain of the transistor Tr102 is electrically connected to the node N102, and the source of the transistor Tr102 is electrically connected to the one end of the current source CS4. The other end of the current source CS4 is electrically connected to the ground potential. The current source CS4 is shared by the differential circuit DIFF2 and the discharge circuit DIS121.

The level of the reference signal VREF_H for discharge may be set at a level higher than the level of the reference signal VREF. For example, if VREF≈VCCQ×½, the level of the reference signal VREF_H for discharge may be set so as to satisfy Formulae (1) and (2).

That is, the discharge circuit DIS121 includes the transistor Tr101 that receives, at the gate, the reference signal VREF_H whose level is higher than the level of the reference signal VREF, and discharges a charge at the intermediate node N101 on the output side in the differential amplifier circuit 220 in accordance with the level of the reference signal VREF_H. As a result, when the level of the power supply voltage VCCQ is low, even when the amplitude of the input signal IN becomes small in response thereto, the discharge circuit DIS121 can form a discharge path between the intermediate node N101 and the ground potential (via the current source CS4) by turning on the transistor Tr101 in a timing with which the intermediate node N101 has to be discharged. For instance, the discharge circuit DIS121 can form a discharge path between the intermediate node N101 and the ground potential by turning on the transistor Tr101 in a timing with which the input signal IN transitions from an H level to an L level. As a result, the discharge circuit DIS121 can appropriately discharge a charge at the intermediate node N101.

The level shifter 250 includes a plurality of inverters IV5, IV6, IV7, and IV8. The input node of the inverter IV5 is connected to a node N231 and the output node of the inverter IV5 is connected to the inverter IV6. The input node of the inverter IV6 is connected to the inverter IV5 and the output node of the inverter IV6 is connected to the output circuit 230. The input node of the inverter IV7 is connected to a node N232 and the output node of the inverter IV7 is connected to the inverter IV8. The input node of the inverter IV8 is connected to the inverter IV7 and the output node of the inverter IV8 is connected to the output circuit 230. The inverter IV7 operates by using the power supply voltage VCCQ, and the inverters IV5, IV6, and IV8 operate by using the power supply voltage VDDC. With this configuration, the level shifter 250 shifts each of the levels of the differential signals and transfers the differential signals to the output circuit 230.

Moreover, the output circuit 230 is configured by omitting the inverters IV3 and IV4 from the output circuit 30 (see FIG. 1). With this configuration, the output circuit 230 generates the output signal OUT in accordance with the differential signals.

As described above, in the fourth embodiment, in the differential amplifier circuits 210 and 220 of the semiconductor device 201, the circuits DIS111 and DIS121 that can form a discharge path from the intermediate nodes N103 and N101, respectively, are provided in parallel with the differential circuits DIFF1 and DIFF2, respectively. As a result, in the semiconductor device 201, the range of the power supply voltage VCCQ in which the differential amplifier circuits 210 and 220 can operate properly can be extended.

Figure 5:
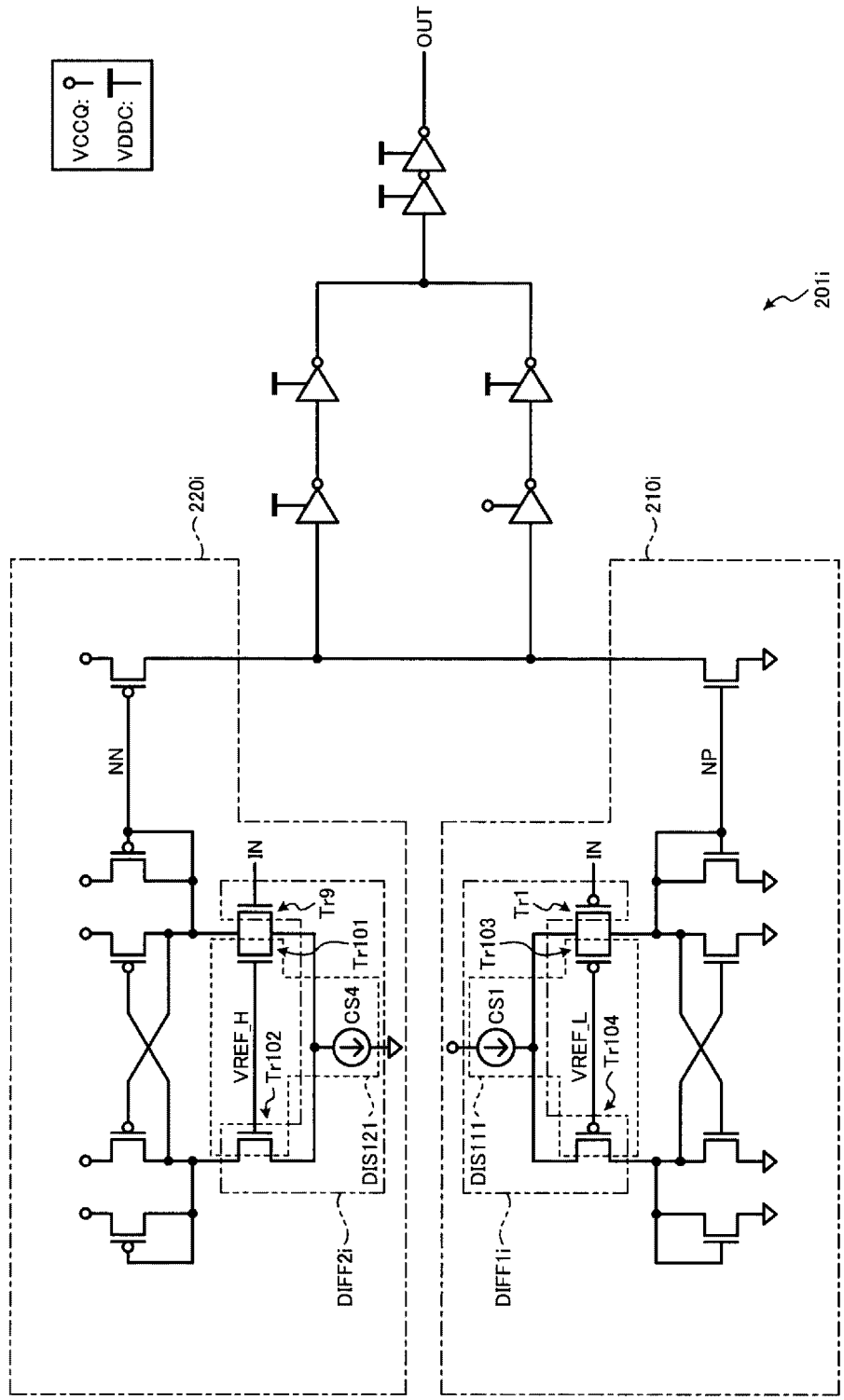
FIG. 5 is a circuit diagram depicting the configuration of a semiconductor device according to a modified example of the fourth embodiment.

The reference signals VREF_L and VREF_H for discharge may also be used as a reference signal for generating a differential signal. In this case, a semiconductor device 201i may be configured as depicted in FIG. 5. FIG. 5 is a circuit diagram depicting the configuration of the semiconductor device 201i according to a modified example of the fourth embodiment. The semiconductor device 201i includes differential amplifier circuits 210i and 220i instead of the differential amplifier circuits 210 and 220 (see FIG. 4).

The differential amplifier circuit 210i includes a differential circuit DIFF1i. The differential circuit DIFF1i does not include the transistor Tr2 (see FIG. 4) and further includes the transistor Tr104. The transistor Tr104 is shared by the differential circuit DIFF1*i* and the discharge circuit DIS111.

That is, the differential amplifier circuit 210*i* receives the input signal IN and the reference signal VREF_L by a pair of the transistors Tr1 and Tr104, respectively, which form a differential pair, and generates a differential signal by amplifying a difference between the input signal IN and the reference signal VREF_L by using the power supply voltage VCCQ.

The differential amplifier circuit 220*i* includes a differential circuit DIFF2*i*. The differential circuit DIFF2*i* does not include the transistor Tr10 (see FIG. 4) and further includes the transistor Tr102. That is, the transistor Tr102 is shared by the differential circuit DIFF2*i* and the discharge circuit DIS121.

That is, the differential amplifier circuit 220*i* receives the input signal IN and the reference signal VREF_H by a pair of the transistors Tr9 and Tr102, respectively, which form a differential pair, and generates a differential signal by amplifying a difference between the input signal IN and the reference signal VREF_H by using the power supply voltage VCCQ.

As described above, since the transistor Tr104 is shared by the differential circuit DIFF1*i* and the discharge circuit DIS111 in the differential amplifier circuit 210*i* and the transistor Tr102 is shared by the differential circuit DIFF2*i* and the discharge circuit DIS121 in the differential amplifier circuit 220*i*, the circuit configuration can be simplified and cost reduction can be achieved.

Fifth Embodiment

Next, a semiconductor device according to a fifth embodiment will be described. Hereinafter, a portion of the semiconductor device according to the fifth embodiment differs from the semiconductor devices according to the first to fourth embodiments will be described.

In the differential amplifier circuits 210 and 220 depicted in FIG. 4, due to the cross-coupled circuits (the transistors Tr21, Tr22, Tr27, and Tr28), jitter, which is a phenomenon in which the timing of transition of the potentials of the bias lines NP and NN varies depending on a signal pattern, may occur. For example, compared to the timing of transition L→H when a signal pattern is L→L→L→H, the timing of the second transition L→H when a signal pattern is L→H→L→H tends to be delayed. This may cause the valid window for a signal to shrink, and, consequently, there is a possibility that the signal cannot be properly used in an internal circuit to which the signal is output. That is, enhancing the speed in such a way as to prevent a delay caused by dependence on a signal pattern while maintaining the effect of the enhanced speed achieved by the cross-coupled circuits is desirable.

Figure 6:
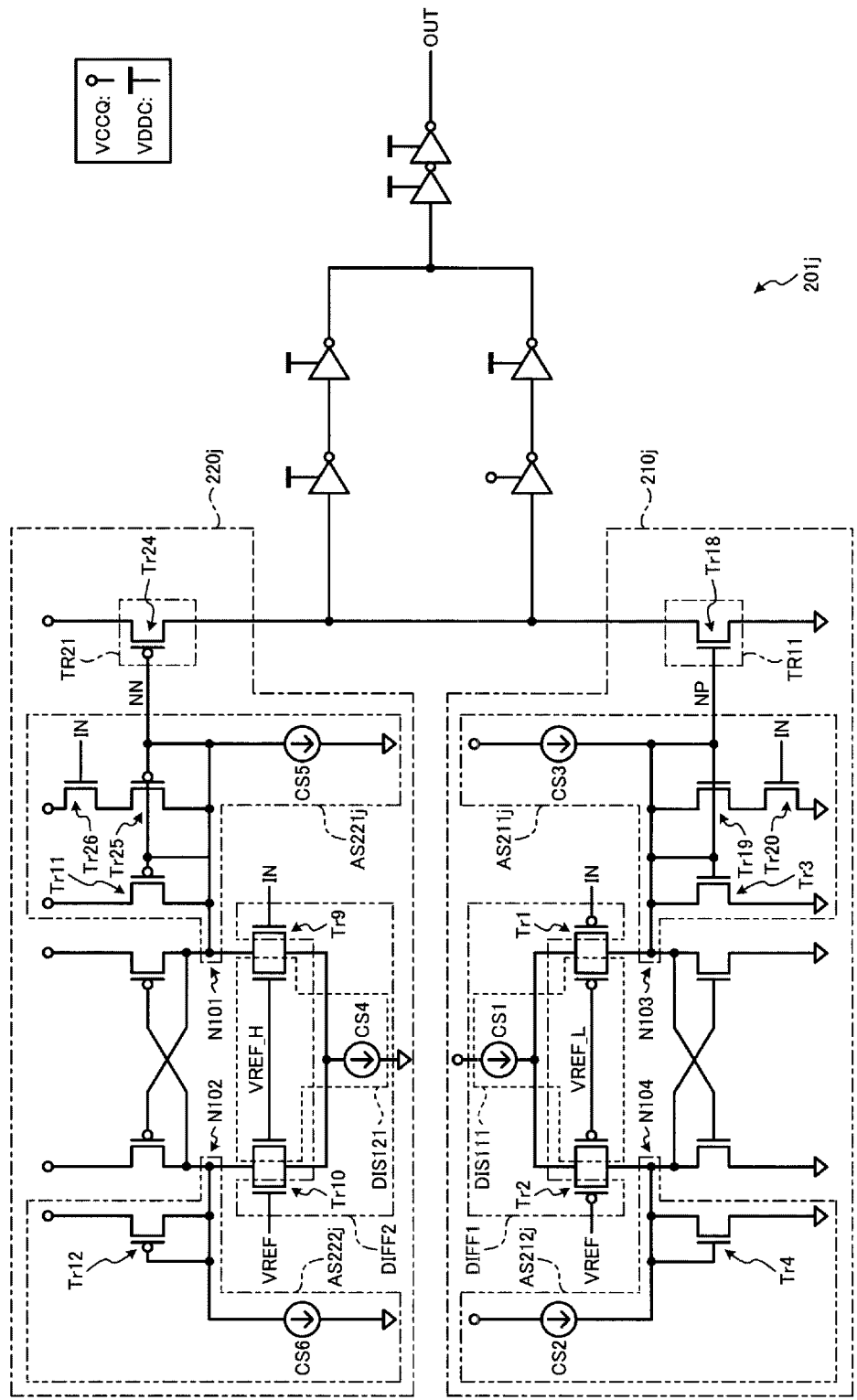
FIG. 6 is a circuit diagram depicting the configuration of a semiconductor device according to a fifth embodiment.

Based on this concept, a semiconductor device 201*j* according to the fifth embodiment may be configured as depicted in FIG. 6. FIG. 6 is a circuit diagram depicting the configuration of the semiconductor device 201*j* according to the fifth embodiment. The semiconductor device 201*j* includes a differential amplifier circuit 210*j* and a differential amplifier circuit 220*j* instead of the differential amplifier circuit 210 and the differential amplifier circuit 220 (see FIG. 4).

The differential amplifier circuit 210*j* includes assist circuits AS211*j* and AS212*j*. The assist circuit AS211*j* may be configured in a manner similar to the assist circuit AS11 (see FIG. 1). The assist circuit AS212*j* may be configured by omitting the transistor Tr6, the transistor Tr7, the transistor Tr8, and the transistor Tr17 from the assist circuit AS12 (see FIG. 1).

In the assist circuit AS211*j*, the transistor Tr3 itself is diode-connected and, in addition thereto, the transistor Tr3 is diode-connected via the transistor Tr19. As a result, the mirror ratio of the drain current of the transistor Tr18 to the drain current of the transistor Tr3 can be changed in accordance with the level of the input signal IN which the transistor Tr20 receives at the gate. Thus, a signal pattern-dependent delay in the timing of transition of the potential of the bias line NP can be prevented.

The differential amplifier circuit 220*j* includes assist circuits AS221*j* and AS222*j*. The assist circuit AS221*j* may be configured in a manner similar to the assist circuit AS21 (see FIG. 1). The assist circuit AS222*j* may be configured by omitting the transistor Tr14, the transistor Tr15, the transistor Tr16, and the transistor Tr23 from the assist circuit AS22 (see FIG. 1).

In the assist circuit AS221*j*, the transistor Tr11 itself is diode-connected and, in addition thereto, the transistor Tr11 is diode-connected via the transistor Tr25. As a result, the mirror ratio of the drain current of the transistor Tr24 to the drain current of the transistor Tr9 can be changed in accordance with the level of the input signal IN which the transistor Tr26 receives at the gate. Thus, a signal pattern-dependent delay in the timing of transition of the potential of the bias line NN can be prevented.

As described above, in the fifth embodiment, the assist circuits AS211*j* and AS221*j* that change the mirror ratio at the time of transfer of the differential signal to the output side in accordance with the input signal are provided in the differential amplifier circuits 210*j* and 220*j*. As a result, the differential amplifier circuits 210*j* and 220*j* can be operated at high speed.

Figure 7:
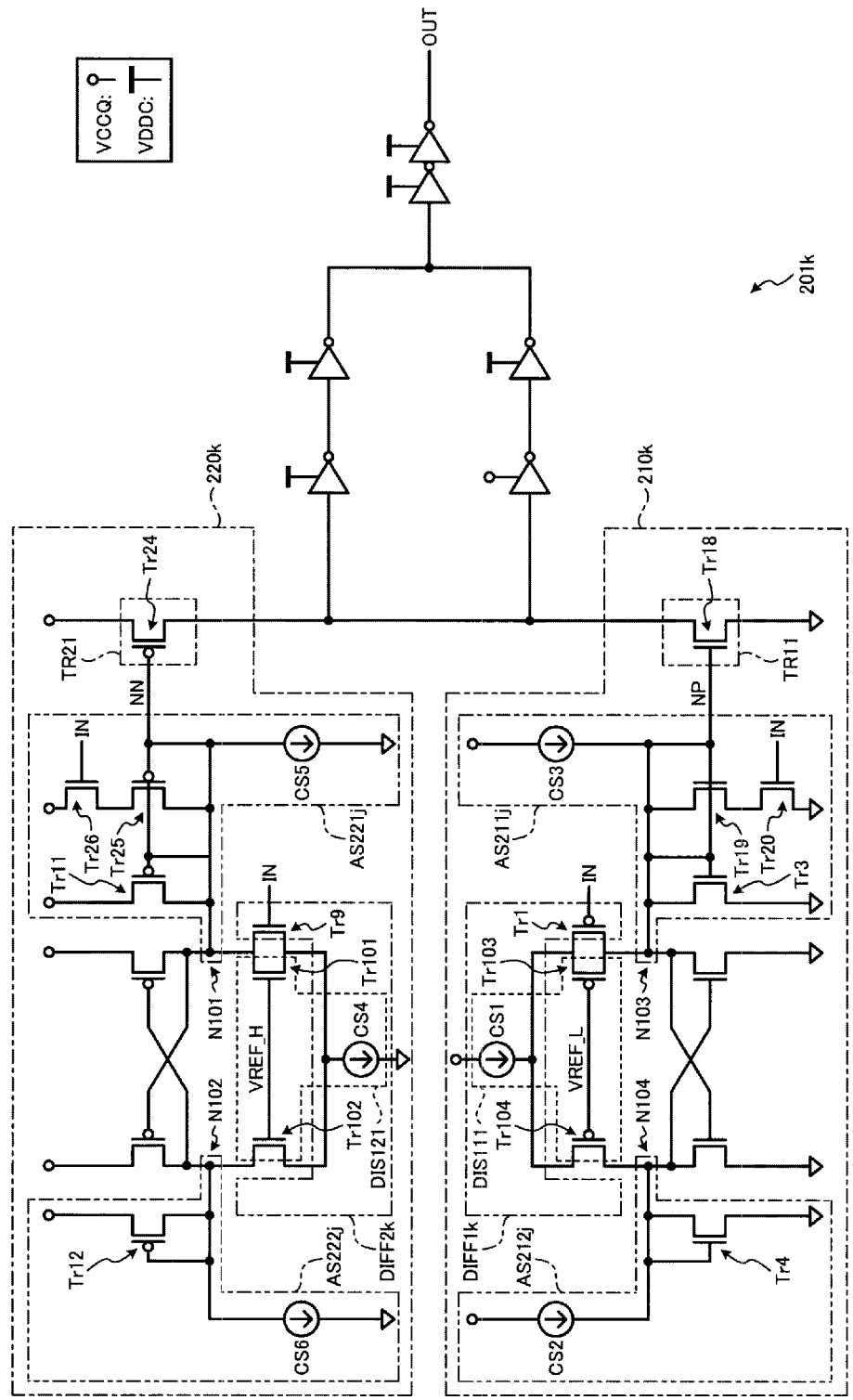
FIG. 7 is a circuit diagram depicting the configuration of a semiconductor device according to a modified example of the fifth embodiment.

The reference signals VREF_L and VREF_H for discharge may also be used as a reference signal for generating a differential signal. In this case, a semiconductor device 201*k* may be configured as depicted in FIG. 7. FIG. 7 is a circuit diagram depicting the configuration of the semiconductor device 201*k* according to a modified example of the fifth embodiment. The semiconductor device 201*k* includes differential amplifier circuits 210*k* and 220*k* instead of the differential amplifier circuits 210*j* and 220*j* (see FIG. 6).

The differential amplifier circuit 210*k* includes a differential circuit DIFF1*k*. The differential circuit DIFF1*k* does not include the transistor Tr2 (see FIG. 6) but further includes the transistor Tr104. The transistor Tr104 is shared by the differential circuit DIFF1*k* and the discharge circuit DIS111.

That is, the differential amplifier circuit 210*k* receives the input signal IN and the reference signal VREF_L by a pair of the transistors Tr1 and Tr104, respectively, which form a differential pair, and generates a differential signal by amplifying a difference between the input signal IN and the reference signal VREF_L by using the power supply voltage VCCQ.

The differential amplifier circuit 220*k* includes a differential circuit DIFF2*k*. The differential circuit DIFF2*k* does not include the transistor Tr10 (see FIG. 6) and further includes the transistor Tr102. That is, the transistor Tr102 is shared by the differential circuit DIFF2*k* and the discharge circuit DIS121.

That is, the differential amplifier circuit 220*k* receives the input signal IN and the reference signal VREF_H by a pair of the transistors Tr9 and Tr102, respectively, which form a differential pair, and generates a differential signal by amplifying a difference between the input signal IN and the reference signal VREF_H by using the power supply voltage VCCQ.

As described above, since the transistor Tr104 is shared by the differential circuit DIFF1k and the discharge circuit DIS111 in the differential amplifier circuit 210k and the transistor Tr102 is shared by the differential circuit DIFF2k and the discharge circuit DIS121 in the differential amplifier circuit 220k, the circuit configuration can be simplified and cost reduction can be achieved.

Sixth Embodiment

Next, a semiconductor device according to a sixth embodiment will be described. Hereinafter, a portion of the semiconductor device according to the sixth embodiment differs from the semiconductor devices according to the first to fifth embodiments will be described.

When an assist circuit is provided in the differential amplifier circuit, the differential amplifier circuit sometimes becomes less operable when the power supply voltage becomes low. For example, if a charge remains at an intermediate node of the differential circuit and the load circuit in the differential amplifier circuit, this may cause deterioration of the duty ratio of the output signal. In this case, by making improvements so that the differential amplifier circuit can operate even at a low power supply voltage, extending the range of the power supply voltage in which the differential amplifier circuit can operate properly is desirable.

Thus, in the sixth embodiment, by providing, in the differential amplifier circuit of the semiconductor device, a circuit that can form a discharge path from an intermediate node of the differential circuit and the load circuit, the range of the power supply voltage in which the differential amplifier circuit can operate properly is extended.

Figure 8:
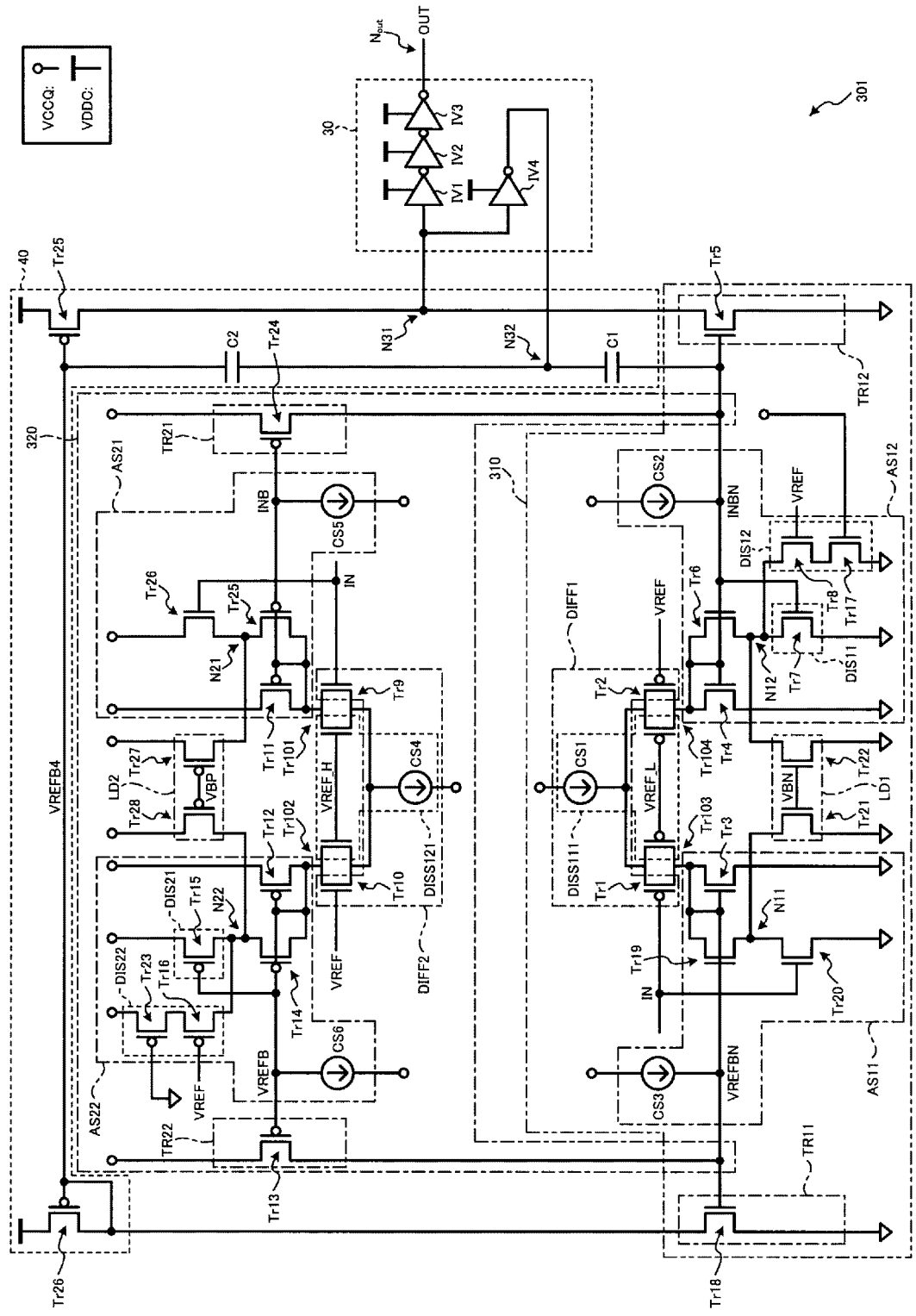
FIG. 8 is a circuit diagram depicting the configuration of a semiconductor device according to a sixth embodiment.

Specifically, a semiconductor device 301 may be configured as depicted in FIG. 8. FIG. 8 is a circuit diagram depicting the configuration of the semiconductor device 301 according to the sixth embodiment.

The semiconductor device 301 includes a differential amplifier circuit 310 and a differential amplifier circuit 320 instead of the differential amplifier circuit 10 and the differential amplifier circuit 20 (see FIG. 1).

The differential amplifier circuit 310 further includes a discharge circuit DISS111. The discharge circuit DISS111 includes the transistor Tr103, the transistor Tr104, and the current source CS1. The transistor Tr103 and the transistor Tr104 form a differential pair. Each of the transistor Tr103 and the transistor Tr104 may be configured with a PMOS transistor. The transistor Tr103 receives the reference signal VREF_L for discharge at the gate, the drain of the transistor Tr103 is electrically connected to the node N103, and the source of the transistor Tr103 is electrically connected to one end of the current source CS1. The transistor Tr104 receives the reference signal VREF_L for discharge at the gate, the drain of the transistor Tr104 is electrically connected to the node N104, and the source of the transistor Tr104 is electrically connected to the one end of the current source CS1. The other end of the current source CS1 is electrically connected to the power supply potential VCCQ. The current source CS1 is shared by the differential circuit DIFF1 and the discharge circuit DISS111.

The level of the reference signal VREF_L for discharge may be set at a level lower than the level of the reference signal VREF. For example, if VREF≈VCCQ×½, the level of the reference signal VREF_L for discharge may be set so as to satisfy Formulae (3) and (4).

That is, the discharge circuit DISS111 includes the transistor Tr104 that receives, at the gate, the reference signal VREF_L whose level is lower than the level of the reference signal VREF, and discharges a charge at the intermediate node N104 on the output side in the differential amplifier circuit 310 in accordance with the level of the reference signal VREF_L. As a result, when the level of the power supply voltage VCCQ is low, even when the amplitude of the input signal IN becomes small in response thereto, the discharge circuit DISS111 can form a discharge path between the intermediate node N104 and the power supply potential VCCQ (via the current source CS1) by turning on the transistor Tr104 with timing with which the intermediate node N104 has be to be discharged. For instance, the discharge circuit DISS111 can form a discharge path between the intermediate node N104 and the power supply potential VCCQ by turning on the transistor Tr104 with timing with which the input signal IN transitions from an H level to an L level. As a result, the discharge circuit DISS111 can appropriately discharge a charge at the intermediate node N104.

The differential amplifier circuit 320 further includes a discharge circuit DISS121. The discharge circuit DISS121 includes the transistor Tr101, the transistor Tr102, and the current source CS4. The transistor Tr101 and the transistor Tr102 form a differential pair. Each of the transistor Tr101 and the transistor Tr102 may be configured with an NMOS transistor. The transistor Tr101 receives the reference signal VREF_H for discharge at the gate, the drain of the transistor Tr101 is electrically connected to the node N101, and the source of the transistor Tr101 is electrically connected to one end of the current source CS4. The transistor Tr102 receives the reference signal VREF_H for discharge at the gate, the drain of the transistor Tr102 is electrically connected to the node N102, and the source of the transistor Tr102 is electrically connected to the one end of the current source CS4. The other end of the current source CS4 is electrically connected to the ground potential. The current source CS4 is shared by the differential circuit DIFF2 and the discharge circuit DISS121.

The level of the reference signal VREF_H for discharge may be set at a level higher than the level of the reference signal VREF. For example, if VREF≈VCCQ×½, the level of the reference signal VREF_H for discharge may be set so as to satisfy Formulae (1) and (2).

That is, the discharge circuit DISS121 includes the transistor Tr101 that receives, at the gate, the reference signal VREF_H whose level is higher than the level of the reference signal VREF, and discharges a charge at the intermediate node N101 on the output side in the differential amplifier circuit 320 in accordance with the level of the reference signal VREF_H. As a result, when the level of the power supply voltage VCCQ is low, even when the amplitude of the input signal IN becomes small in response thereto, the discharge circuit DISS121 can form a discharge path between the intermediate node N101 and the ground potential (via the current source CS4) by turning on the transistor Tr101 with timing with which the intermediate node N101 has to be discharged. For instance, the discharge circuit DISS121 can form a discharge path between the intermediate node N101 and the ground potential by turning on the transistor Tr101 with timing with which the input signal IN transitions from an H level to an L level. As a result, the discharge circuit DISS121 can appropriately discharge a charge at the intermediate node N101.

As described above, in the sixth embodiment, in the differential amplifier circuits 310 and 320 of the semiconductor device 301, the circuits DISS111 and DISS121 that can form a discharge path from the intermediate nodes N104 and N101, respectively, are provided in parallel with the differential circuits DIFF1 and DIFF2, respectively. As a result, in the semiconductor device 301, the range of the power supply voltage VCCQ in which the differential amplifier circuits 310 and 320 can operate properly can be extended.

Figure 9:
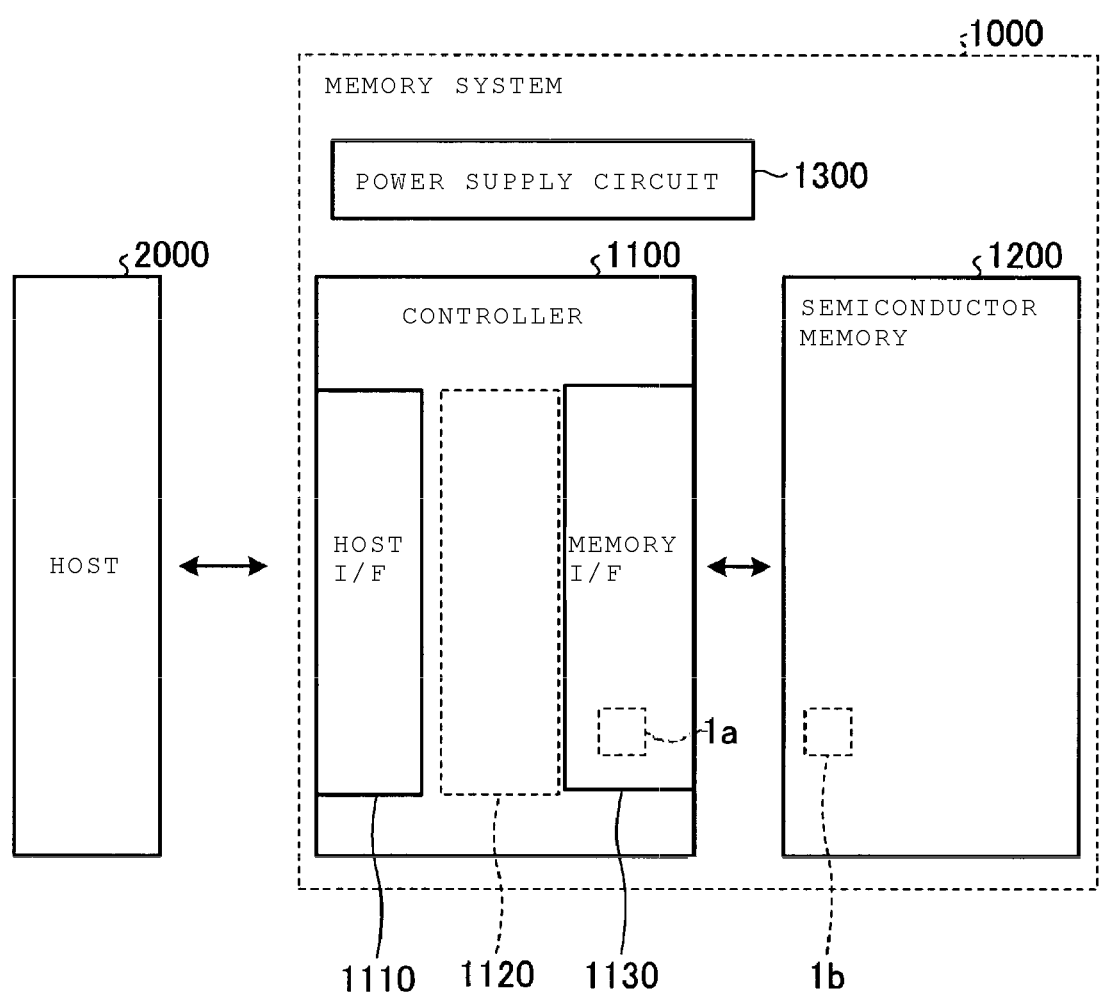
FIG. 9 is a circuit diagram depicting the configuration of a memory system to which the semiconductor devices according to the first to sixth embodiments and the modified examples thereof are applicable.

Next, a memory system 1000 to which the semiconductor devices according to the first to sixth embodiments and the modified examples thereof are applied will be described by using FIG. 9. FIG. 9 is a diagram depicting the configuration of the memory system 1000 to which the semiconductor devices according to the first to sixth embodiments and the modified examples thereof are applied.

The memory system 1000 is connectable to a host 2000 and may function as an external storage medium of the host 2000. The host 2000 is, for example, a personal computer, and the memory system 1000 is, for example, an SSD. The memory system 1000 includes a controller 1100, semiconductor memory 1200, and a power supply circuit 1300. The controller 1100 is a circuit as hardware and includes a host interface circuit (a host I/F) 1110, a signal processing circuit 1120, and a memory interface circuit (a memory I/F) 1130. The power supply circuit 1300 generates a plurality of types of power supply voltages (for example, the power supply voltages VCCQ and VDDC) and supplies the power supply voltages to the portions in the memory system 1000.

For instance, the semiconductor memory 1200 includes a semiconductor device 1*b* as a receiver. Any of the semiconductor devices according to the first to sixth embodiments and the modified examples thereof is applicable to the semiconductor device 1*b*. The memory I/F 1130 receives a predetermined signal from the signal processing circuit 1120 and transfers the signal to the semiconductor device 1*b*. The semiconductor device 1*b* operates under the power supply voltages (for example, the power supply voltages VCCQ and VDDC) received from the power supply circuit 1300 and receives the signal transferred from the memory I/F 1130. The semiconductor device 1*b* supplies the received signal to the semiconductor memory 1200.

Such a signal may be, for example, write data, a reference potential, a chip selection signal (CE), a command latch enable signal (CLE), an address latch enable signal (ALE), a write enable signal (WE), a write protect signal (WP), or the like to the semiconductor memory 1200.

The memory I/F 1130 includes a semiconductor device 1*a* as a receiver. Any of the semiconductor devices according to the first to sixth embodiments and the modified examples thereof is applicable to the semiconductor device 1*a*. The semiconductor memory 1200 transfers a predetermined signal to the semiconductor device 1*a*. The semiconductor device 1*a* operates under the power supply voltages (for example, the power supply voltages VCCQ and VDDC) received from the power supply circuit 1300 and receives the signal transferred from the semiconductor memory 1200. The semiconductor device 1*a* supplies the received signal to the signal processing circuit 1120.

Such a signal may be, for example, read data, a ready/busy signal (R/B), or the like from the semiconductor memory 1200.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first differential amplifier circuit including:
      a first transistor configured to receive a first input signal at a gate of the first transistor;
      a second transistor connected in parallel between a source and a drain of the first transistor and configured to receive a first reference signal at a gate of the second transistor;
      a third transistor, forming a differential pair with the second transistor, configured to receive the first reference signal at a gate of the third transistor;
      a fourth transistor connected in parallel between a source and a drain of the third transistor and configured to receive a second reference signal at a gate of the fourth transistor, the second reference signal lower than the first reference signal;
      a fifth transistor having a source connected to a power supply voltage and a drain connected to the drain of the first transistor and the second transistor at a first node; and
      a sixth transistor having a source connected to the power supply voltage and a drain connected to the drain of the third transistor, a drain of the fourth transistor, and a gate of the fifth transistor at a second node.

2. The semiconductor device according to claim 1, further comprising:
   a second differential amplifier circuit, which forms a differential pair with the first differential amplifier circuit, including:
      a fifth transistor configured to receive a second input signal at a gate of the fifth transistor;
      a sixth transistor connected in parallel between a source and a drain of the fifth transistor and configured to receive a third reference signal at a gate of the sixth transistor; and
      a seventh transistor, forming a differential pair with the sixth transistor, configured to receive the third reference signal at a gate of the seventh transistor.

3. The semiconductor device according to claim 2, wherein
   the second differential amplifier circuit further includes an eighth transistor connected in parallel between a source and a drain of the seventh transistor and configured to receive the second reference signal at a gate of the eighth transistor.

4. The semiconductor device according to claim 2, wherein
   the first differential amplifier circuit further includes:
      a ninth transistor connected in series with the second transistor;
      a tenth transistor, disposed on an output side of the first differential amplifier circuit, configured as a first current mirror circuit with the ninth transistor;
      an eleventh transistor, connected in parallel with the ninth transistor, configured as a second current mirror circuit with the tenth transistor; and
      a first discharge circuit connected to a source of the eleventh transistor; and the second differential amplifier circuit further includes:
a thirteenth transistor connected in series with the sixth transistor;
a fourteenth transistor, disposed on an output side of the second differential amplifier circuit, configured as a third current mirror circuit with the thirteenth transistor;
a fifteenth transistor, connected in parallel with the thirteenth transistor, configured as a fourth current mirror circuit with the fourteenth transistor; and
a second discharge circuit connected to a source of the fifteenth transistor.

5. The semiconductor device of claim 1, wherein the semiconductor device is configured as a receiver of at least one of a semiconductor memory or a memory interface configured to receive a signal.

6. The semiconductor device of claim 4, wherein the first discharge circuit is configured to discharge a charge at an intermediate node connected between the eleventh transistor and the first discharge circuit.

7. The semiconductor device of claim 4, wherein the second discharge circuit is configured to discharge a charge at an intermediate node connected between the fifteenth transistor and the second discharge circuit.

8. The semiconductor device of claim 1, wherein the second transistor and the third transistor at least form part of a discharge circuit configured to discharge charge on the first node to a ground by turning on the second transistor in a timing with which the first input signal transitions from a first level to a second level.

9. The semiconductor device of claim 8, wherein the first transistor and the fourth transistor at least form part of a differential circuit in parallel with the discharge circuit.

10. The semiconductor device of claim 1, wherein the power supply voltage, first reference voltage, and second reference voltage meet the following conditions:
the second reference voltage≈½×the power supply voltage; and
the first reference voltage=the second reference voltage+ΔV,
wherein 0<ΔV<½×the power supply voltage.

11. A memory controller comprising:
a host interface circuit configured to receive a command from a host;
a processing circuit configured to control the controller; and
a memory interface circuit configured to transmit the command to a semiconductor memory and receive data from the semiconductor memory, wherein the memory interface includes:
a first transistor configured to receive a first input signal at a gate of the first transistor;
a second transistor connected in parallel between a source and a drain of the first transistor and configured to receive a first reference signal at a gate of the second transistor;
a third transistor, forming a differential pair with the second transistor, configured to receive the first reference signal at a gate of the third transistor;
a fourth transistor connected in parallel between a source and a drain of the third transistor and configured to receive a second reference signal at a gate of the fourth transistor, the second reference signal lower than the first reference signal;
a fifth transistor having a source connected to a power supply voltage and a drain connected to the drain of the first transistor and the second transistor at a first node; and
a sixth transistor having a source connected to the power supply voltage and a drain connected to the drain of the third transistor, a drain of the fourth transistor, and a gate of the fifth transistor at a second node.

12. The memory controller of claim 11, wherein the second transistor and the third transistor at least form part of a discharge circuit configured to discharge charge on the first node to a ground by turning on the second transistor in a timing with which the first input signal transitions from a first level to a second level.

13. The memory controller of claim 12, wherein the first transistor and the fourth transistor at least form part of a differential circuit in parallel with the discharge circuit.

14. The memory controller of claim 11, wherein the power supply voltage, first reference voltage, and second reference voltage meet the following conditions:
the second reference voltage≈½×the power supply voltage; and
the first reference voltage=the second reference voltage+ΔV,
wherein 0<ΔV<½×the power supply voltage.

15. A memory system comprising:
a controller; and
a semiconductor memory connected to the controller, wherein the controller includes:
a host interface circuit configured to receive a command from a host;
a processing circuit configured to control the controller; and
a memory interface circuit configured to transmit the command to a semiconductor memory and receive data from the semiconductor memory, wherein the memory interface includes:
a first transistor configured to receive a first input signal at a gate of the first transistor;
a second transistor connected in parallel between a source and a drain of the first transistor and configured to receive a first reference signal at a gate of the second transistor;
a third transistor, forming a differential pair with the second transistor, configured to receive the first reference signal at a gate of the third transistor;
a fourth transistor connected in parallel between a source and a drain of the third transistor and configured to receive a second reference signal at a gate of the fourth transistor, the second reference signal lower than the first reference signal;
a fifth transistor having a source connected to a power supply voltage and a drain connected to the drain of the first transistor and the second transistor at a first node; and
a sixth transistor having a source connected to the power supply voltage and a drain connected to the drain of the third transistor, a drain of the fourth transistor, and a gate of the fifth transistor at a second node.

16. The memory controller of claim 15, wherein the second transistor and the third transistor at least form part of a discharge circuit configured to discharge charge on the first node to a ground by turning on the second transistor in a timing with which the first input signal transitions from a first level to a second level.

17. The memory controller of claim 16, wherein the first transistor and the fourth transistor at least form part of a differential circuit in parallel with the discharge circuit.

\* \* \* \* \*